United States Patent
Fujii et al.

(10) Patent No.: US 7,024,738 B2
(45) Date of Patent: Apr. 11, 2006

(54) METHOD FOR CONTROLLING A DIRECTION OF POLARIZATION OF A PIEZOELECTRIC THIN FILM

(75) Inventors: Satoru Fujii, Takatsuki (JP); Isaku Kanno, Nara (JP); Ryoichi Takayama, Suita (JP); Takeshi Kamada, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 406 days.

(21) Appl. No.: 10/116,096

(22) Filed: Apr. 4, 2002

(65) Prior Publication Data

US 2002/0149296 A1    Oct. 17, 2002

Related U.S. Application Data

(62) Division of application No. 09/573,475, filed on May 17, 2000, now abandoned.

(30) Foreign Application Priority Data

May 21, 1999    (JP) .................................. 11-142058

(51) Int. Cl.
H04R 17/00    (2006.01)
H01L 41/04    (2006.01)
H01L 41/08    (2006.01)
H01L 41/18    (2006.01)
H02N 2/00    (2006.01)

(52) U.S. Cl. ...................... 29/25.35; 29/592.1; 29/593; 29/594; 29/830; 29/831; 29/842; 310/328

(58) Field of Classification Search ............... 29/25.35, 29/830, 831, 842, 593, 592.1, 594; 310/328, 310/317, 330, 331, 332; 204/192.15, 192.18
See application file for complete search history.

(56) References Cited

U.S. PATENT DOCUMENTS

| | | | |
|---|---|---|---|
| 3,457,463 A | | 7/1969 | Balamuth |
| 4,812,698 A | * | 3/1989 | Chida et al. ................. 310/330 |
| 4,985,926 A | * | 1/1991 | Foster .......................... 381/77 |
| 5,034,649 A | * | 7/1991 | Chida et al. ................. 310/332 |
| 5,233,256 A | * | 8/1993 | Hayashi et al. ............. 310/317 |
| 5,268,974 A | * | 12/1993 | Hikita et al. .................. 385/19 |
| 5,404,067 A | * | 4/1995 | Stein et al. .................. 310/330 |
| 5,491,500 A | | 2/1996 | Inui et al. |
| 5,763,982 A | | 6/1998 | Tabota et al. |
| 5,914,556 A | | 6/1999 | Tabota et al. |
| 5,991,988 A | | 11/1999 | Tabota et al. |
| 6,169,355 B1 | | 1/2001 | Furlani et al. |

FOREIGN PATENT DOCUMENTS

DE    195 23 984 A1    3/1996

(Continued)

*Primary Examiner*—A. Dexter Tugbang
*Assistant Examiner*—Tai Van Nguyen
(74) *Attorney, Agent, or Firm*—Harness, Dickey & Pierce, P.L.C.

(57) ABSTRACT

To manufacture a compact and high-performance thin-film piezoelectric bimorph element at low cost, first and second piezoelectric thin films (2, 3) are formed by sputtering on the both surfaces of a metal thin plate (1) which are opposing relation to each other along the thickness thereof, while the respective states of polarizations of the first and second piezoelectric thin films (2, 3) are controlled. A pair of electrode films (5) are formed on the respective surfaces of the first and second piezoelectric thin films (2, 3) opposite to the metal thin plate (1).

2 Claims, 18 Drawing Sheets

FOREIGN PATENT DOCUMENTS

| | | |
|---|---|---|
| EP | 0 480 645 A1 | 4/1992 |
| EP | 0 634 273 A2 | 1/1995 |
| EP | 0 764 992 A1 | 3/1997 |
| JP | 0151077 | 9/1983 |
| JP | 0019383 | 1/1984 |
| JP | 0175777 | 10/1984 |
| JP | 0178677 | 9/1985 |
| JP | 08288564 A | 11/1996 |
| JP | 08293631 A | 11/1996 |
| JP | 08293632 A | 11/1996 |

\* cited by examiner

METHOD FOR CONTROLLING A DIRECTION OF POLARIZATION OF A PIEZOELECTRIC THIN FILM

CROSS-REFERENCE TO RELATED APPLICATIONS

This application is a divisional of U.S. patent application Ser. No. 09/573,475 filed on May 17, 2000 now ABN. The disclosure(s) of the above application(s) is (are) incorporated herein by reference. This application claims the benefit of Japanese application serial number 11-142058, filed May 21, 1999.

BACKGROUND OF THE INVENTION

1. Field of the Invention

The present invention relates to a thin-film piezoelectric bimorph element, a mechanical detector and an inkjet head using the same, and methods of manufacturing the same.

2. Description of the Prior Art

In recent years, research and development has been conducted on a dielectric substance, in particular a ferroelectric substance, as a basic material of a pyroelectric IR detector using a pyroelectric property, a piezoelectric detector (sensor) and a piezoelectric actuator using a piezoelectric property, a nonvolatile memory using polarization inversion, a capacitive element using a high-dielectric-constant property, and the like.

The piezoelectric detector has been used as a mechanical detector for detecting a dynamic amount such as acceleration or pressure by using a "piezoelectric effect," which is the generation of charge from a piezoelectric member as a result of the application of a force to the piezoelectric member. The piezoelectric detector features an eminently high sensitivity to voltage.

In contrast to the detector, the piezoelectric actuator provides a dynamic amount such as deformation by using a strain caused by the application of a voltage to a piezoelectric member. The piezoelectric actuator features excellent responsivity and the capability of precise control of an extremely small displacement.

If the piezoelectric detector or piezoelectric actuator is designed to have a bimorph structure in which a pair of piezoelectric members are bonded to the both surfaces of a metal plate which are in opposing relation to each other along the thickness thereof (piezoelectric bimorph element), the performance thereof can be improved significantly.

In a conventional piezoelectric bimorph element, a pair of piezoelectric members that have been subjected to a polarization process are bonded adhesively to the both surfaces of a metal plate which are in opposing relation to each other along the thickness thereof. However, since it is extremely difficult to uniformly control the thickness and hardening of an adhesive agent, the conventional piezoelectric bimorph element has the problem of sensitivity variations due to non-uniform adhesion.

Moreover, since one of the piezoelectric members provided on the both surfaces of the metal plate which are in opposing relation to each other along the thickness thereof contracts and the other expands, a high stress is produced at the adhesion interface. Over a prolonged period of use, the piezoelectric members may peel off the metal plate, which leads to the problem of insufficient durability.

Furthermore, the thickness of the piezoelectric members cannot be reduced excessively since a certain degree of rigidity is required by the piezoelectric members to adhere to the metal plate. This makes it difficult to fabricate a bimorph element using thin-film piezoelectric members (thin-film piezoelectric bimorph element).

Accordingly, it is impossible to scale down the conventional piezoelectric bimorph element and increase the performance thereof. It is therefore difficult to scale down a mechanical detector or an inkjet head using the element and improve the performance thereof.

The present invention has been achieved in view of the foregoing and it is therefore an object of the present invention to enable the manufacturing of a compact and high-performance thin-film piezoelectric bimorph element at low cost.

SUMMARY OF THE INVENTION

To attain the object, the present invention has formed, by sputtering, a pair of piezoelectric thin films on both surfaces of the metal thin plate which are in opposing relation to each other along the thickness thereof, while controlling the respective states of polarizations of the piezoelectric thin films.

Specifically, a thin-film piezoelectric bimorph element according to the present invention comprises: a metal thin plate; a pair of piezoelectric thin films formed by sputtering on both surfaces of the metal thin plate which are in opposing relation to each other along the thickness thereof, while respective states of polarizations of the piezoelectric thin films are controlled; and a pair of electrode films provided on respective surfaces of the piezoelectric thin films which are opposite to the metal thin plate.

In the arrangement, the pair of piezoelectric thin films are formed by sputtering on the both surfaces of the metal thin plate as a substrate for film formation which are in opposing relation to each other along the thickness thereof. As a result, uniform and considerably thin piezoelectric thin films can be formed on the both surfaces of the metal thin plate which are in opposing relation to each other along the thickness thereof, while the piezoelectric thin films can be bonded tightly to the metal thin plate. Accordingly, a compact and high-performance thin-film piezoelectric bimorph element can be obtained easily at low cost. For polarization control, there can be adopted a method in which the temperature of the metal film used as the substrate for film formation is controlled or the like.

In the thin-film piezoelectric bimorph element, the directions of polarizations of the pair of piezoelectric thin films may be opposite to each other or the same.

In the thin-film piezoelectric bimorph element, each of the piezoelectric thin films is composed preferably of a plurality of piezoelectric layers stacked along the thickness of the metal thin plate, the piezoelectric layers having a piezoelectric constant which decreases gradually with approach toward the metal thin plate. Alternatively, each of the piezoelectric thin films has a piezoelectric constant which preferably increases gradually with distance from the metal thin plate toward the opposite side thereof. This prevents the production of a high stress in a portion of each of the piezoelectric thin films closer to the metal plate so that the piezoelectric thin film is less likely to peel off the metal thin plate.

In the thin-film piezoelectric bimorph element, each of the piezoelectric thin films has a thickness adjusted preferably to 10 μm or less. This allows effective scaling down of the thin-film piezoelectric bimorph element. Moreover, the time required to form the piezoelectric thin films is reduced considerably and the composition of the piezoelectric thin films is controlled more easily.

In the thin-film piezoelectric bimorph element, a pair of diffusion preventing films for preventing diffusion of a substance composing the metal thin plate in the piezoelectric thin films are provided preferably between the metal thin plate and the individual piezoelectric thin films. This prevents a substance (such as Cr) adversely affecting the piezoelectric thin films from being diffused in the piezoelectric thin films and maintains the performance of the thin-film piezoelectric bimorph element at a high level.

A mechanical detector according to the present invention has a dynamic amount detecting portion, the dynamic amount detecting portion being composed of a thin-film piezoelectric bimorph element having: a metal thin plate; a pair of piezoelectric thin films formed by sputtering on both surfaces of the metal thin plate which are in opposing relation to each other along the thickness thereof, while respective states of polarizations of the piezoelectric thin films are controlled; and a pair of electrode films provided on respective surfaces of the piezoelectric thin films which are opposite to the metal thin plate. This allows easy and low-cost formation of a compact and high-performance mechanical detector, similarly to the thin-film piezoelectric bimorph element.

In the mechanical detector, the dynamic amount detecting portion includes a plurality of dynamic amount detecting portions which are provided to bend in different directions. This allows pressure or acceleration acting in different directions to be detected by a single detector.

In the mechanical detector, the dynamic amount detecting portion includes a plurality of dynamic amount detecting portions having different natural frequencies. This allows high-accuracy detection of a dynamic amount such as pressure or acceleration when the dynamic amount varies periodically whether a frequency of the variation is high or low.

An inkjet head according to the present invention comprises: a head main body formed with a depressed portion for a pressure chamber, the depressed portion having a supply port for ink supply and a discharge port for ink discharge; and an actuator for causing the ink in the pressure chamber to be discharged from the discharge port, the actuator being disposed to cover the depressed portion of the head main body and define the pressure chamber in combination with the depressed portion, the actuator being composed of a thin-film piezoelectric bimorph element having: a metal thin plate; a pair of piezoelectric thin films formed by sputtering on both surfaces of the metal thin plate which are in opposing relation to each other along the thickness thereof, while respective states of polarizations of the piezoelectric thin films are controlled; and a pair of electrode films provided on respective surfaces of the piezoelectric thin films which are opposite to the metal thin plate. The arrangement allows easy and low-cost formation of a compact and high-performance inkjet head, similarly to the thin-film piezoelectric bimorph element.

A method of manufacturing a thin-film piezoelectric bimorph element according to the present invention comprises the steps of: forming a pair of piezoelectric thin films by sputtering on both surfaces of a metal thin plate which are in opposing relation to each other along the thickness thereof, while controlling respective states of polarizations of the piezoelectric thin films; and forming a pair of electrode films on respective surfaces of the piezoelectric thin films which are opposite to the metal thin plate. The arrangement allows easy and low-cost formation of a compact and high-performance thin-film piezoelectric bimorph element.

The step of forming the piezoelectric thin films may include: forming the pair of piezoelectric thin films such that the directions of polarizations thereof are opposite to each other or the same.

In the case where the directions of polarizations of the pair of piezoelectric thin films are the same, the step of forming the piezoelectric thin films may include the steps of: forming the first piezoelectric thin film by sputtering on one of both surfaces of the metal thin plate which are in opposing relation to each other along the thickness thereof, while adjusting a temperature of the metal thin plate to a specified level and controlling the state of polarization of the first piezoelectric thin film; and after the step of forming the first piezoelectric thin film, forming the second piezoelectric thin film by sputtering on the other of the both surfaces of the metal thin plate which are in opposing relation to each other along the thickness thereof, while adjusting the temperature of the metal thin plate to a level lower than the specified level and controlling the state of polarization of the second piezoelectric thin film, the second piezoelectric thin film having the same direction of polarization as the first piezoelectric thin film.

In this case, one of the both surfaces of the metal thin plate which are in opposing relation to each other along the thickness thereof is oriented upward and the first piezoelectric thin film is formed thereon such that the direction of polarization of the first piezoelectric thin film is oriented, e.g., downward. Thereafter, the metal thin plate is vertically inverted such that the other of the both surfaces of the metal thin plate which are in opposing relation to each other along the thickness thereof is oriented upward (the direction of polarization of the first piezoelectric thin films is oriented upward as a result of the vertical inversion) and the second piezoelectric thin film is formed thereon. Since the temperature of the metal thin plate is lower than during the formation of the first piezoelectric thin film, the direction of polarization of the second piezoelectric thin film can be oriented upward, which is opposite to the direction of polarization of the first piezoelectric thin film during the formation thereof. Thus, the first and second piezoelectric thin films can be formed to have the same direction of polarizations by a simple method.

The step of forming the piezoelectric thin films preferably includes: forming each of the piezoelectric thin films by stacking a plurality of piezoelectric layers having different piezoelectric constants along the thickness of the metal thin plate such that the piezoelectric constants are in increasing order or forming each of the piezoelectric thin films such that a piezoelectric constant of the piezoelectric thin film increases gradually with distance from the metal thin plate toward the opposite side thereof. In the arrangement, each of the piezoelectric thin films is less likely to peel off the metal thin plate and durability is increased.

The method according to the present invention may further comprise, prior to the step of forming the piezoelectric thin films: the step of forming a pair of diffusion preventing films for preventing diffusion of a substance composing the metal thin plate in the piezoelectric thin films on the both surfaces of the metal thin plate which are opposing relation to each other along the thickness thereof. This prevents a substance adversely affecting the piezoelectric thin films from being diffused in the piezoelectric thin films.

A method of manufacturing a mechanical detector having a plurality of dynamic amount detecting portions each composed of a thin-film piezoelectric bimorph element according to the present invention comprises the steps of: forming a pair of piezoelectric thin films by sputtering on both surfaces of a metal thin plate which are opposing relation to each other along the thickness thereof, while controlling respective states of polarizations of the piezoelectric thin films; forming a pair of electrode films on respective surfaces of the piezoelectric thin films which are opposite to the metal thin plate; and patterning each of the piezoelectric thin films and of the electrode films into a specified configuration, processing the metal thin plate into a specified configuration after patterning, and thereby forming the plurality of dynamic amount detecting portions.

In the arrangement, each of the piezoelectric thin films and of the electrode films is patterned by etching or the like into a specified configuration and the metal thin plate is formed into a specified configuration by an etching process, a laser process, or the like so that the dynamic amount detecting portions each composed of a thin-film piezoelectric bimorph element are formed into cantilevers and fixed-end beams. This allows easy and low-cost formation of a compact and high-performance mechanical detector.

The step of forming the plurality of dynamic amount detecting portions preferably includes: forming the plurality of dynamic amount detecting portions such that the dynamic amount detecting portions bend in different directions. If a bending process or the like is performed with respect to the metal thin plate, the plurality of dynamic amount detecting portions can be formed easily such that they bend in different directions. This allows pressure or acceleration acting in different directions to be detected by a single mechanical detector.

The step of forming the plurality of dynamic amount detecting portions preferably includes: forming the plurality of dynamic amount detecting portions into different configurations such that the dynamic amount detecting portions have different natural frequencies. This easily allows the plurality of dynamic amount detecting portions to have different natural frequencies and ensures the detection of an acceleration of an oscillation irrespective of a frequency of the oscillation.

A method of manufacturing an inkjet head having an actuator for ink discharge composed of a thin-film piezoelectric bimorph element according to the present invention comprises the steps of: forming a pair of piezoelectric thin films by sputtering on both surfaces of a metal thin plate which are opposing relation to each other along the thickness thereof, while controlling respective states of polarizations of the piezoelectric thin films; forming a pair of electrode films on the respective surfaces of the piezoelectric thin films which are opposite to the metal thin plate; patterning each of the piezoelectric thin films and of the electrode films into a specified configuration; and, after the patterning step, fixing the metal thin plate to a head main body having a depressed portion for a pressure chamber which composes the pressure chamber in combination with the metal thin plate. This allows easy and low-cost formation of a compact and high-performance inkjet head.

DESCRIPTION OF PREFERRED EMBODIMENTS OF THE INVENTION

Figure 1:
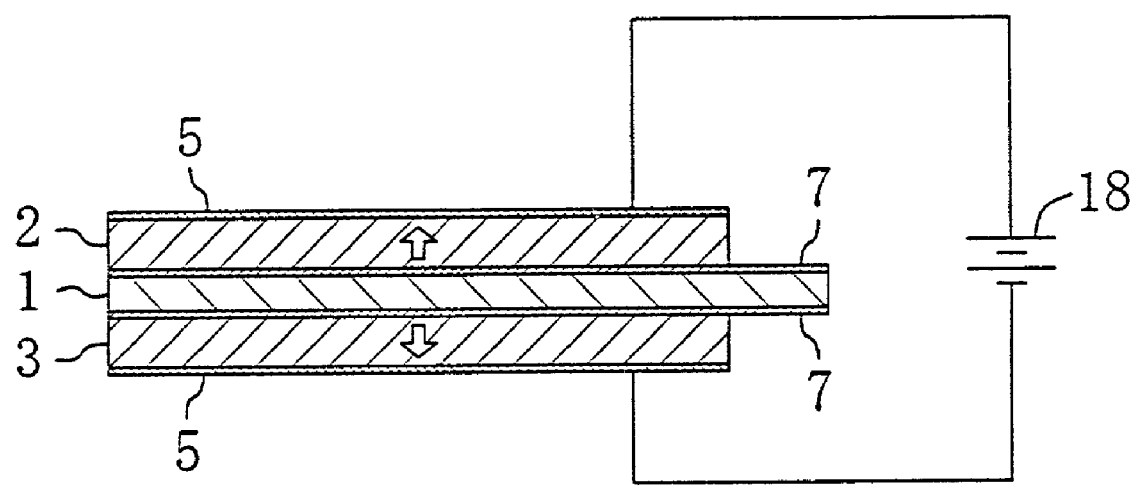
FIG. 1 is a cross-sectional view of a thin-film piezoelectric bimorph element according to Embodiment 1 of the present invention.

Referring now to the drawings, the embodiments of the present invention will be described.

Embodiment 1

FIG. 1 shows a thin-film piezoelectric bimorph element according to Embodiment 1 of the present invention. The thin-film piezoelectric bimorph element comprises a metal thin plate 1 made of stainless steel and having a thickness of 50 to 200 µm (preferably 50 to 100 µm).

A first piezoelectric thin film 2 is provided on one of the both surfaces (upper surface) of the metal thin plate 1 which are in opposing relation to each other along the thickness thereof with a diffusion preventing film 7 interposed therebetween, which will be described later, while a second piezoelectric thin film 3 is provided on the other of the both surfaces (lower surface) of the metal thin plate 1 which are in opposing relation to each other along the thickness thereof with another diffusion preventing film 7 interposed therebetween. The first and second piezoelectric thin films 2 and 3 having equal thicknesses are formed by sputtering on the both surfaces of the metal thin plate 1 as a substrate for film formation which are in opposing relation to each other along the thickness thereof, while the respective states of polarizations thereof are controlled. The directions of polarizations of the first and second piezoelectric thin films 2 and 3 are opposite to each other (see the arrows in FIG. 1). That is, the directions of polarizations of the first and second piezoelectric thin films 2 and 3 are oppositely oriented relative to the metal thin plate 1 along the thickness thereof (upward in the first piezoelectric thin film 2 and downward in the second piezoelectric thin film 3). The thickness of each of the first and second piezoelectric thin films 2 and 3 is preferably 10 µm or less. The arrangement allows effective scaling down of the thin-film piezoelectric bimorph element. In addition, the first and second piezoelectric thin films 2 and 3 can be formed in a relatively short period of time and the compositions of the first and second piezoelectric thin films 2 and 3 can be controlled easily.

The composition of each of the first and second piezoelectric thin films 2 and 3 is represented appropriately by $Pb_pLa_qTi_rZr_sO_3$ provided that the values of p, q, r, and s satisfy any of the following numerical expressions (1) to (3). However, $Pb_{0.9}La_{0.1}Ti_{0.975}O_3$ (PLT), $PbTiO_3$, $PbZr_{0.50}Ti_{0.50}O_3$ (PZT), $Pb_{0.9}La_{0.1}(Zr_{0.1}Ti_{0.9})_{0.975}O_3$ (PLZT), or the like is particularly preferred.

$$0.7 \leq p \leq 1,\ p+q=1,\ 0.925 \leq r \leq 1,\ s=0 \quad (1)$$

$$p=1,\ q=0,\ 0 \leq r \leq 0.50,\ r+s=1 \quad (2)$$

$$0.75 \leq p \leq 1,\ p+q=1,\ 0.3 \leq r < 1,\ r+s=1 \quad (3)$$

A pair of electrode films 5 each made of Pt and having a thickness of 0.1 to 0.2 µm are formed on the surface (upper surface) of the first piezoelectric thin film 2 which is opposite to the metal thin plate 1 and on the surface (lower surface) of the second piezoelectric thin film 3 which is opposite to the metal thin plate 1.

A pair of diffusion preventing films 7 for preventing the diffusion of a substance (especially Cr) composing the metal thin plate 1 in the first and second piezoelectric thin films 2 and 3 are provided between the metal thin plate 1 and the first piezoelectric thin film 2 and between the metal thin plate 1 and the second piezoelectric thin film 3. Each of the diffusion preventing films 7 is made of Pt, similarly to each of the electrode films 5, and has a thickness adjusted to 0.1 to 0.2 µm. Although each of the diffusion preventing films 7 also functions as an electrode, each of the diffusion preventing films 7 is not necessarily required.

After the electrode film 5 on the first piezoelectric thin film 2 and the electrode film 5 on the second piezoelectric thin film 3 are connected to the positive and negative terminals of a power source 18, respectively, if a voltage is applied between the two electrode films 5, a downward electric field is produced in each of the first and second piezoelectric thin films 2 and 3, as shown in FIG. 1. This expands the first piezoelectric thin film 2 and contracts the second piezoelectric thin film 3 so that the thin-film piezoelectric bimorph element bends to protrude upward. Conversely, if a voltage is applied between the two electrode films 5 after the electrode film 5 on the first piezoelectric thin film 2 and the electrode film 5 on the second piezoelectric thin film 3 are connected to the negative and positive terminals of the power source 18, respectively, the thin-film piezoelectric bimorph element bends to protrude downward. Hence, the thin-film piezoelectric bimorph element can be used as an actuator which is operated with the application of a voltage.

When the thin-film piezoelectric bimorph element is deformed by an external force, on the other hand, a voltage is generated between the two electrode films 5, which allows the thin-film piezoelectric bimorph element to be used as a mechanical detector for detecting a dynamic amount such as acceleration or pressure.

A description will be given to a method of manufacturing the thin-film piezoelectric bimorph element with reference to FIG. 2.

Figure 2A:
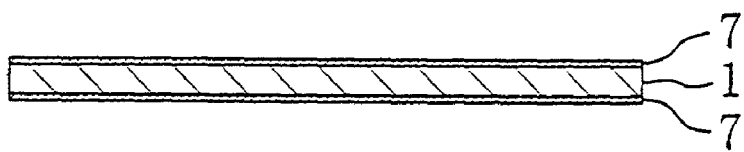
FIGS. 2(a) through (d) are schematic views illustrating a method of manufacturing the thin-film piezoelectric bimorph element of FIG. 1.
Figure 2B:
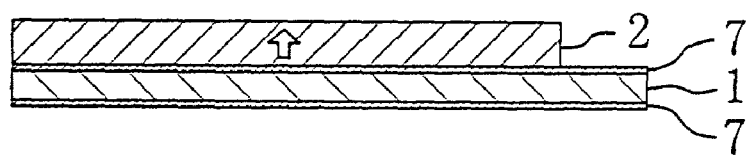

First, the pair of diffusion preventing films 7 (Pt films) are formed on the both surfaces of the metal plate 1 as a substrate for film formation which are in opposing relation to each other along the thickness thereof (see FIG. 2(a)). Specifically, the diffusion preventing films 7 are formed by, e.g., RF magnetron sputtering using a gas mixture of Ar and oxygen (at a mixture ratio of 95/5 to 80/20) under such conditions that the temperature of the metal thin plate 1 (substrate temperature) is 500 to 700° C., the pressure of the sputter gas is 0.1 to 5 Pa, and the density of RF power applied is 1 to 5 W/cm² (at a frequency of 13.56 MHz). After one hour of film formation, the diffusion preventing films 7 each having a thickness of about 0.15 µm are obtained.

Subsequently, the first and second piezoelectric thin films 2 and 3 are formed by sputtering on the respective surfaces of the two diffusion preventing films 7 which are opposite to the metal thin plate 1, while the respective states of polarizations thereof are controlled. Specifically, the first piezoelectric thin film 2 is formed first on the upper surface of one of the diffusion preventing films 7 that has been oriented upward (see FIG. 2(b)). Table 1 shows specific conditions for film formation when the first piezoelectric thin film 2 made of a material such as PLT, $PbTiO_3$, PZT, or PLZT is formed by RF magnetron sputtering (at a frequency of 13.56 MHz).

TABLE 1

| Material of Piezo-electric Thin Film | Composition of Target | Temperature of Metal Thin Plate | Sputter Gas (Ar/O$_2$ = %/%) | Gas Pressure (Pa) | RF Power Density (W/cm$^2$) | Film Thickness (μm) |
|---|---|---|---|---|---|---|
| PLT | Mixture of PbO, La$_2$O$_3$, and TiO$_2$ Powder (Excess of 20 mol % PbO) | 570 to 630° C. | 50/50 to 98/2 | 0.1 to 5.0 | 1 to 5 | 3 |
| PbTiO$_3$ | Mixture of PbO and TiO$_2$ Powder (Excess of 20 mol % PbO) | 570 to 630° C. | 50/50 to 98/2 | 0.1 to 5.0 | 1 to 5 | 3 |
| PZT | Sintered PZT (Excess of 20 mol % PbO) | 570 to 630° C. | 50/50 to 98/2 | 0.1 to 5.0 | 1 to 5 | 3 |
| PLZT | Sintered PLZT (Excess of 20 mol % PbO) | 570 to 630° C. | 50/50 to 98/2 | 0.1 to 5.0 | 1 to 5 | 3 |

The first piezoelectric thin film 2 formed under the foregoing conditions has a tetragonal crystal structure and the direction of polarization thereof becomes upward (it is also possible to render the direction of polarization downward by adjusting the temperature of the metal thin plate 1 to a level higher than listed in Table 1). In short, the polarization axes are oriented equally in the (001) direction. This may be because the metal thin plate 1 reduces a thermal stress in the first piezoelectric thin film 2 in the cooling process after film formation since the thermal expansion coefficient of the metal thin plate 1 is higher than that of the first piezoelectric thin film 2.

Figure 2C:
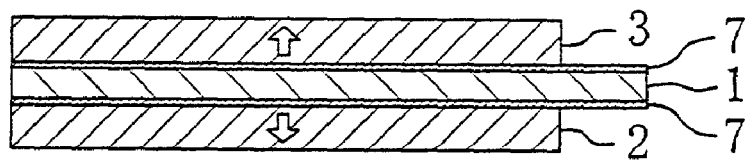

After the first piezoelectric thin film 2 is thus formed, the metal thin plate 1 is vertically inverted and the second piezoelectric thin film 3 is formed under the same conditions as used in forming the first piezoelectric thin film 2 (see FIG. 2(c)). At this time, the direction of polarization of the second piezoelectric thin film 3 also becomes upward, while the direction of polarization of the first piezoelectric thin film 2 is downward as a result of the vertical inversion. Therefore, the directions of polarizations of the first and second piezoelectric thin films 2 and 3 are opposite to each other.

Figure 2D:
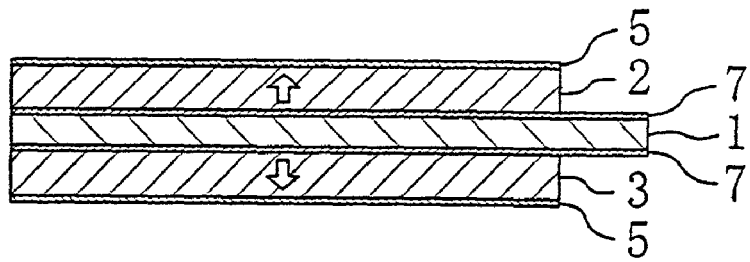

Next, the electrode films 5 are formed on the respective surfaces of the first and second piezoelectric thin films 2 and 3 which are opposite to the metal thin plate 1 (see FIG. 2(d)). A specific method of forming each of the electrode films 5 is the same as used in forming the diffusion preventing films 7.

Then, the first and second piezoelectric thin films 2 and 3 and the pair of electrodes 5 are patterned optionally to have proper configurations depending on the application of the thin-film piezoelectric bimorph element.

Specifically, the pair of electrode films 5 are patterned first by sputter etching. If the electrode films 5 are etched in a vacuum of about 8 Pa by using Ar gas at a flow rate of 10 sccm with a plasma power of 170 W, the etching is completed in about 15 minutes.

Subsequently, the first and second piezoelectric thin films 2 and 3 are patterned by chemical etching. Table 2 shows process conditions for chemical etching when the first and second piezoelectric thin films 2 and 3 are made of a material such as PLT, PbTiO$_3$, PZT, or PLZT.

TABLE 2

| Material of Piezoelectric Thin Film | Etching Method | Process Conditions | Film Thickness (μm) | Process Time (min) |
|---|---|---|---|---|
| PLT | Chemical Etching | HF/HNO$_3$/H$_2$O = 5/1/15 to 5/20/15, Etchant Temperature = 25° C. | 3 | 3 |
| PbTiO$_3$ | Chemical Etching | HF/HNO$_3$/H$_2$O = 5/1/15 to 5/20/15, Etchant Temperature = 25° C. | 3 | 3 |
| PZT | Chemical Etching | HF/HNO$_3$/H$_2$O = 5/1/15 to 5/20/15, Etchant Temperature = 25° C. | 3 | 3 |
| PLZT | Chemical Etching | HF/HNO$_3$/H$_2$O = 5/1/15 to 5/20/15, Etchant Temperature = 25° C. | 3 | 3 |

Next, the pair of diffusion preventing films 7 are patterned by the same method as used in patterning the pair of electrode films 5. If necessary, the metal thin plate 1 is processed by etching or by using a laser, whereby the thin-film piezoelectric bimorph element is completed.

Thus, since Embodiment 1 has formed the first and second piezoelectric thin films 2 and 3 by sputtering on the both surfaces of the metal thin plate 1 which are in opposing relation to each other along the thickness thereof with the pair of diffusion preventing films 7 interposed therebetween, comparatively thin first and second piezoelectric thin films 2 and 3 can be formed uniformly and bonded securely to the metal thin plate 1 (this is also true in the absence of the diffusion preventing films 7). This provides a thin-film piezoelectric bimorph element which is more compact than in the case where the piezoelectric members are bonded adhesively to the metal plate and eliminates sensitivity variations resulting from the bonding of the first and second piezoelectric thin films 2 and 3 to the metal thin plate 1. Moreover, the first and second piezoelectric thin films 2 and 3 can be formed easily by sputtering and the respective directions of polarizations thereof can be controlled easily by adjusting the temperature of the metal thin plate 1. Accordingly, the thin-film piezoelectric bimorph element can be manufactured at a low cost.

Furthermore, the first and second piezoelectric thin films 2 and 3 and the like can be patterned easily by etching, which allows simultaneous manufacturing of a plurality of thin-film piezoelectric bimorph elements.

The material of the metal thin plate 1 is not limited to stainless steel. The metal thin plate 1 may also be made of a metal such as Ti, Pt, phosphor bronze, or beryllium bronze. The material of the diffusion preventing films 7 may be a precious metal such as Au, Pd, or Ag other than Pt. In the case of using the thin-film piezoelectric bimorph element in an application in which no problem occurs even if the properties of the element vary slightly due to oxidation or corrosion, it is also possible to use a metal other than a precious metal and an anticorrosive metal (this is also true in the following Embodiments 2 to 8).

The diffusion preventing films 7 may also be formed by chemical vapor deposition, plating, or the like instead of sputtering. The diffusion preventing films 7 need not necessarily be formed entirely over the both surfaces of the metal thin plate 1 which are in opposing relation to each other along the thickness thereof. It is sufficient to form the diffusion preventing films 7 on at least portions to be formed with the first and second piezoelectric thin films 2 and 3.

Figure 3:
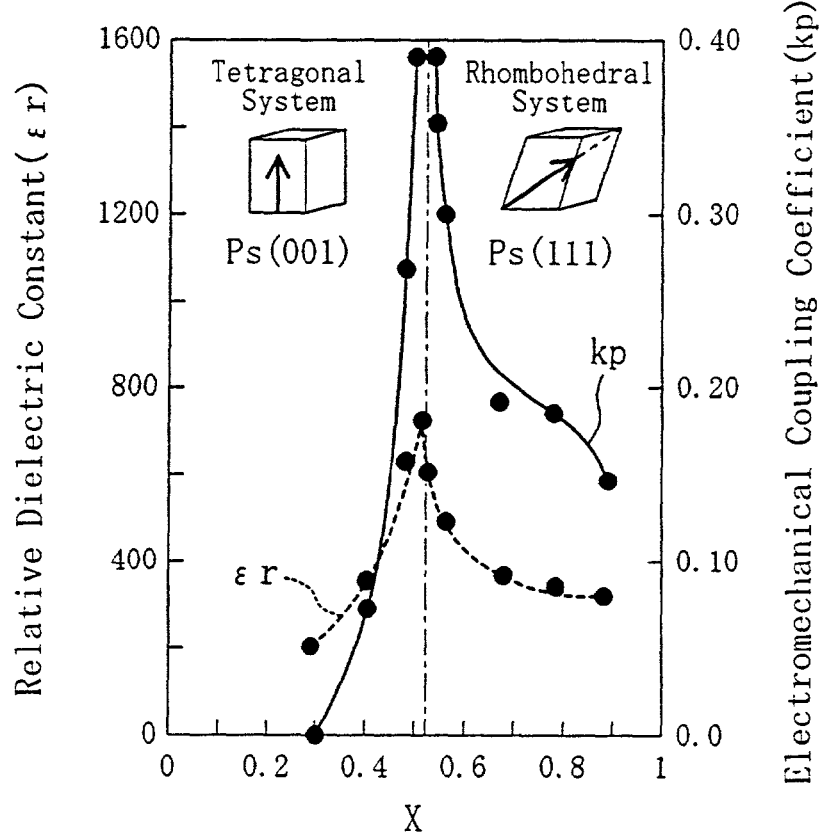
FIG. 3 is a view showing variations in relative dielectric constant and in electromechanical coupling coefficient when the value of X is varied in $PbZr_xTi_{1-x}O_3$.

A description will be given below to the directions of the polarization axes of the first and second piezoelectric thin films 2 and 3. The directions of the polarization axes of the first and second piezoelectric thin films 2 and 3 change depending on the composition thereof. If the composition of the first and second piezoelectric thin films 2 and 3 is $PbZr_xTi_{1-x}O_3$, e.g., the crystal structure thereof change with the value of X (proportion of Zn to Ti), as shown in FIG. 3. If the value of X is small, the crystal structure is tetragonal and the polarization axes (Ps) are oriented in the (001) direction. If the value of X is large, the crystal structure is rhombohedral and the polarization axes are oriented in the (111) direction.

Thus, the polarization axes are oriented in the (001) direction if the values of p, q, r and sin $Pb_pLa_qTi_rZr_sO_3$ representing the composition of the first and second piezoelectric thin films 2 and 3 satisfy either of the following numerical expressions (a) and (b).

$$p=1, q\ 0, 0.5 \leq r < 1, r+s = 1 \quad (a)$$

$$0.9 \leq p < 1, p+q = 1, 0 \leq r < 0.5, r+s = 1 \quad (b)$$

The crystal structure of the first and second piezoelectric thin films 2 and 3 is not limited to a tetragonal system in which the polarization axes are oriented in the (001) direction and may be a rhombohedral system in which the polarization axes are oriented in the (111) direction, as described above.

Embodiment 2

Figure 4:
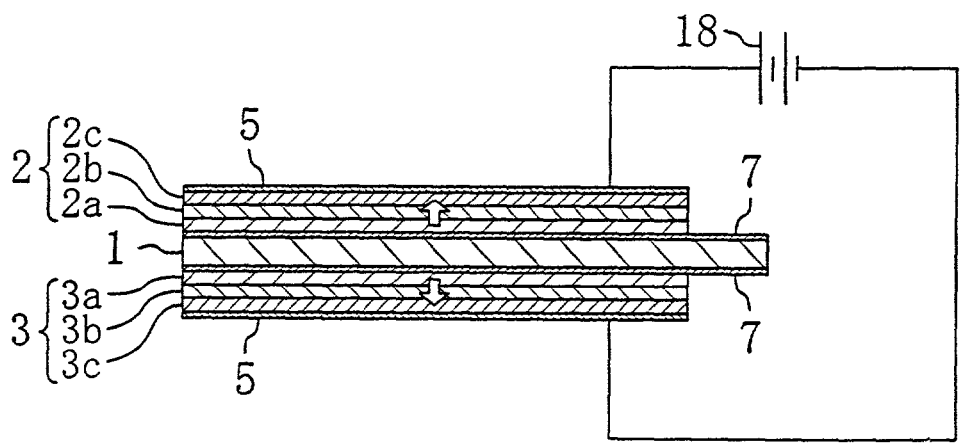
FIG. 4 is a cross-sectional view of a thin-film piezoelectric bimorph element according to Embodiment 2 of the present invention.
Figure 5A:
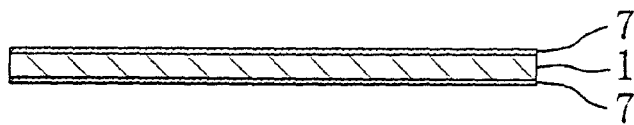
FIGS. 5(a) through (d) are schematic views illustrating a method of manufacturing the thin-film piezoelectric bimorph element of FIG. 4.
Figure 5B:
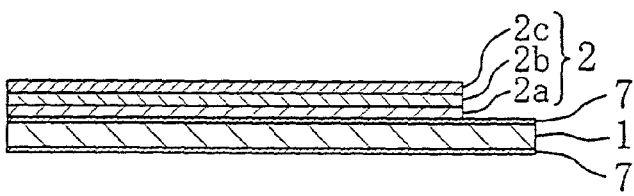
Figure 5C:
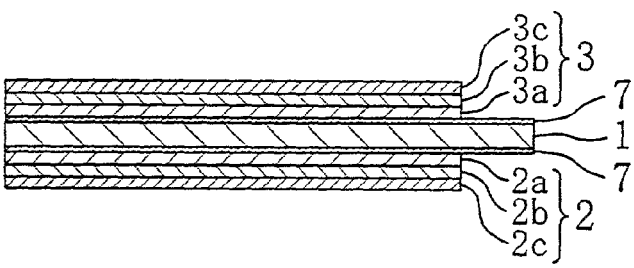
Figure 5D:
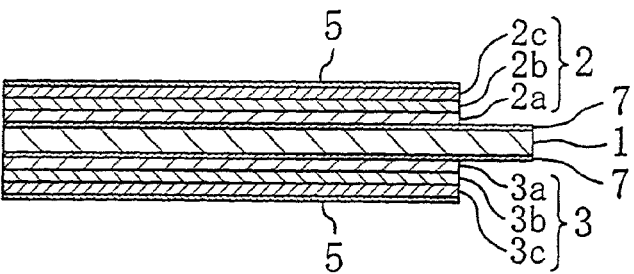

FIG. 4 shows Embodiment 2 of the present invention (in each of the following embodiments, the detailed description of the same components as shown in FIG. 1 will be omitted by retaining the same reference numerals), in which each of first and second piezoelectric thin films 2 and 3 has a multilayer structure.

That is, the first piezoelectric thin film 2 in Embodiment 2 is composed of a plurality of (three in the present embodiment) piezoelectric layers 2a, 2b, and 2c stacked along the thickness of the metal thin plate 1. The piezoelectric layers 2a, 2b, and 2c are constituted to have a piezoelectric constant which decreases gradually with approach toward the metal thin plate 1. Specifically, if the composition of the first piezoelectric thin film 2 is represented by $PbZr_xTi_{1-x}O_3$ as described above, the value of X is changed appropriately for each of the piezoelectric layers 2a, 2b, and 2c to change the proportion of Zn to Ti. If the value of X is thus changed, the electromechanical coupling coefficient kp varies significantly, as shown in FIG. 3, so that the piezoelectric constant is changeable. Similarly to the first piezoelectric thin film 2, the second piezoelectric thin film 3 is also composed of three piezoelectric layers 3a, 3b, and 3c stacked along the thickness of the metal thin plate 1 which are also constituted to have a piezoelectric constant which decreases gradually with approach toward the metal thin plate 1. The directions of polarizations of the first and second piezoelectric thin films 2 and 3 are the same as in Embodiment 1 so that the directions of polarizations of the individual piezoelectric layers 2a, 2b, and 2c of the first piezoelectric thin film 2 are upward and the directions of polarizations of the individual piezoelectric layers 3a, 3b, and 3c of the second piezoelectric thin films 3 are downward.

A description will be given to a method of manufacturing such a thin-film piezoelectric bimorph element with reference to FIG. 5.

First, a pair of diffusion preventing films 7 are formed on the both surfaces of the metal thin plate 1 which are in opposing relation to each other along the thickness thereof (see FIG. 5(*a*)), similarly to Embodiment 1.

Figure 6:
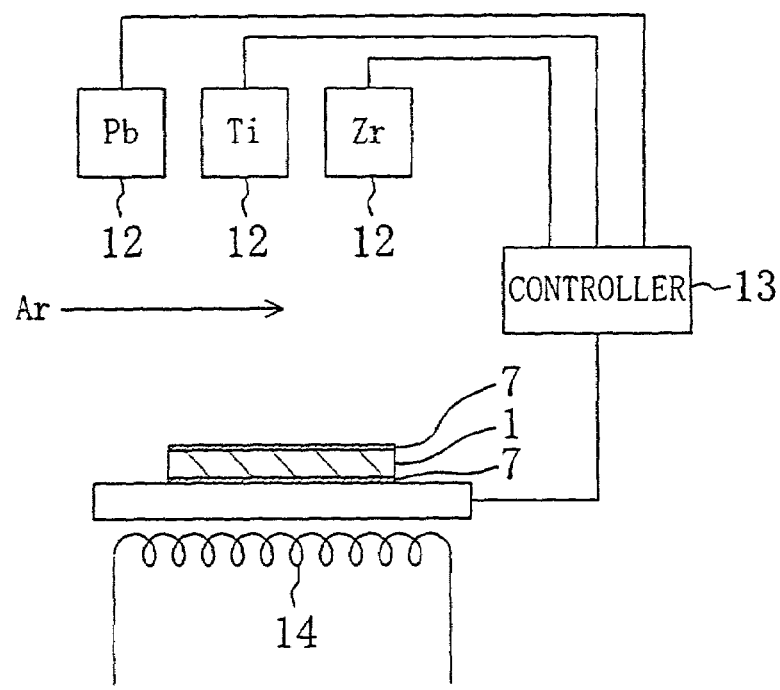
FIG. 6 is a schematic structural view of a multiple sputtering system.

Subsequently, the first piezoelectric thin film 2 is formed on the upper surface of one of the diffusion preventing films 7 that has been oriented upward. Specifically, the three piezoelectric layers 2a, 2b, and 2c having different piezoelectric constants are stacked along the thickness of the metal thin plate 1 such that the piezoelectric constants thereof are in increasing order (see FIG. 5(*b*)). The method of forming the piezoelectric layers 2a, 2b, and 2c is the same as the method of forming the first and second piezoelectric thin films 2 and 3 used in Embodiment 1. To vary the composition for each of the piezoelectric layers 2a, 2b, and 2c, however, composition control is performed by using, e.g., a multiple sputtering system as shown in FIG. 6. That is, if the composition is represented by $PbZr_xTi_{1-x}O_3$, the composition is varied by controlling RF power applied to each of metal targets 12 of Pb, Ti, and Zn by using a controller 13. In FIG. 6, a heater for heating the metal thin plate 1 to a specified temperature is designated at 14.

Then, the second piezoelectric thin film 3 is formed on the upper surface of the other of the diffusion preventing films 7 that has been oriented upward. Specifically, the three piezoelectric layers 3a, 3b, and 3c having different piezoelectric constants are stacked such that the piezoelectric constants thereof are in increasing order (see FIG. 5(*c*)), similarly to the first piezoelectric thin film 2.

Table 3 shows the compositions of the piezoelectric layers 2a, 2b, and 2c of the first piezoelectric thin film 2 and of the piezoelectric layers 3a, 3b, and 3c of the second piezoelectric thin film 3 and conditions for film formation.

TABLE 3

| Reference Numerals of Piezoelectric Layers | Composition of Piezoelectric Thin Film | Temperature of Metal Thin Plate | Film Thickness (μm) |
|---|---|---|---|
| 2a, 3a | $PbZr_{0.30}Ti_{0.70}O_3$ | 570 to 630° C. | 1.0 |
| 2b, 3b | $PbZr_{0.45}Ti_{0.55}O_3$ | 570 to 630° C. | 1.0 |
| 2c, 3c | $PbZr_{0.52}Ti_{0.48}O_3$ | 570 to 630° C. | 1.0 |

Next, the electrode films 5 are formed on the respective surfaces of the first and metal piezoelectric thin films 2 and 3 which are opposite to the metal thin plate 1 (see FIG. 5(*d*)), similarly to Embodiment 1. Thereafter, the first and second piezoelectric thin films 2 and 3, the pair of electrode films 5, and the like are patterned if necessary.

Thus, since the individual piezoelectric layers 2a, 2b, and 2c of the first piezoelectric thin film 2 and the individual piezoelectric layers 3a, 3b, and 3c of the second piezoelectric thin film 3 are constituted to have a piezoelectric constant which decreases gradually with approach toward the metal thin plate 1, the first and second piezoelectric thin films 2 and 3 are less likely to peel off the metal thin plate 1. Although the metal thin plate 1 neither expands nor contracts, the rigidity thereof is by far larger than that of the first and second piezoelectric thin films 2 and 3 so that a high tensile stress or compressive stress is produced at the joints between the first and second piezoelectric thins films 2 and 3 and the metal thin plate 1. Since the first and second piezoelectric tin films 2 and 3 are particularly susceptible to a tensile stress, the durability on the side on which a tensile stress is produced presents a problem. However, the piezoelectric constants of the piezoelectric layers 2a and 3a which are closest to the metal thin plate 1 have been reduced considerably, as described above, so that a strain resulting from the expansion or contraction of the piezoelectric layers 2a and 3a is slight. Accordingly, the stress produced at the portions of the first and second piezoelectric thin films 2 and 3 joined with the metal thin plate 1 can be reduced. Even over a prolonged period of use, therefore, the first and second piezoelectric thin films 2 and 3 will not peel off the metal thin plate 1 so that the durability of the thin-plate piezoelectric bimorph element is improved.

Although each of the first and second piezoelectric thin films 2 and 3 has the multilayer structure in Embodiment 2, they may have a piezoelectric constant which increases gradually with distance from the metal thin plate 1 toward the opposite side thereof in a single-layer structure as used in Embodiment 1, not in a multilayer structure. In this case, the composition is varied gradually in forming the first and second piezoelectric thin films 2 and 3 such that the piezoelectric constant increases gradually with distance from the metal thin plate 1 toward the opposite side thereof.

Embodiment 3

Figure 7:
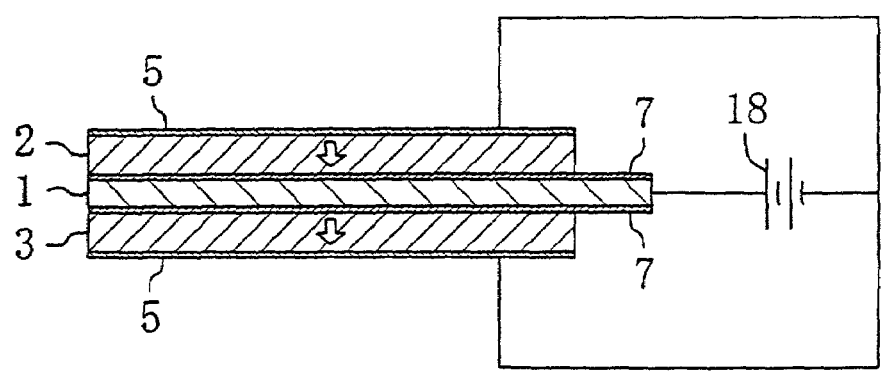
FIG. 7 is a cross-sectional view of a thin-film piezoelectric bimorph element according to Embodiment 3 of the present invention.
Figure 8A:
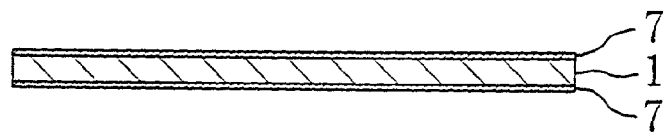
FIGS. 8(a) through (d) are schematic views illustrating a method of manufacturing the thin-film piezoelectric bimorph element of FIG. 7.
Figure 8B:
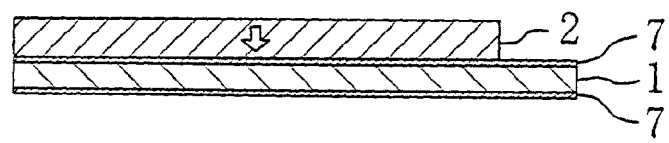
Figure 8C:
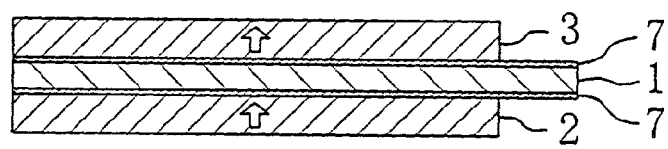
Figure 8D:
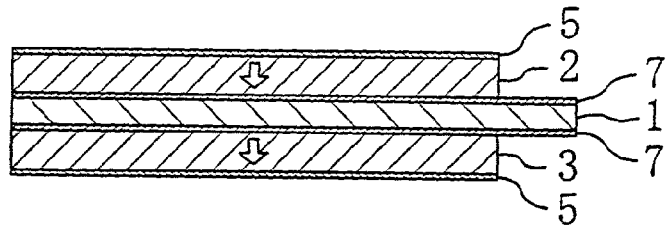

FIG. 7 shows Embodiment 3 of the present invention, in which the directions of polarizations of the first and second piezoelectric thin films 2 and 3 are the same. That is, the direction of polarization of the first piezoelectric thin film 2 is from the side opposite to the metal thin plate 1 toward the metal thin plate 1 (downward), which is different from Embodiments 1 and 2.

After a pair of electrode films 5 are connected to the negative terminal of a power source 18 and a metal thin plate 1 (or diffusion preventing films 7 as electrodes) is connected to the positive terminal thereof, if a voltage is applied between the metal thin plate 1 and each of the electrode films 5, an upward electric field is generated in the first piezoelectric thin film 2, while a downward electric field is produced in the second piezoelectric thin film 3, as shown in FIG. 7. This expands the first piezoelectric thin film 2 and contracts the second piezoelectric thin film 3 so that the thin-film piezoelectric bimorph element bends to protrude upward. Conversely, if a voltage is applied between the metal thin plate 1 and each of the electrode films 5 after the pair of electrode films 5 are connected to the positive terminal of the power source 18 and the metal thin plate 1 is connected to the negative terminal thereof, the thin-plate piezoelectric bimorph element bends to protrude downward.

A description will be given to a method of manufacturing the thin-film piezoelectric bimorph element with reference to FIG. 8.

First, the diffusion preventing films 7 are formed on the both surfaces of the metal thin plate 1 which are in opposing relation to each other along the thickness thereof, similarly to Embodiment 1 (see FIG. 8(*a*)).

Subsequently, the first piezoelectric thin film 2 is formed on one of the diffusion preventing films 7 that has been oriented upward (see FIG. 8(*b*)). In forming the first piezoelectric thin film 2, the temperature of the metal thin plate 1 is adjusted to be higher than the temperature range (570 to 630° C.) listed in Table 1 so that the direction of polarization of the first piezoelectric thin film 2 is oriented downward (the conditions other than the temperature of the metal thin plate 1 are the same as listed in Table 1). Specifically, the temperature of the metal thin plate 1 is adjusted to 670 to 720° C.

Figure 9:
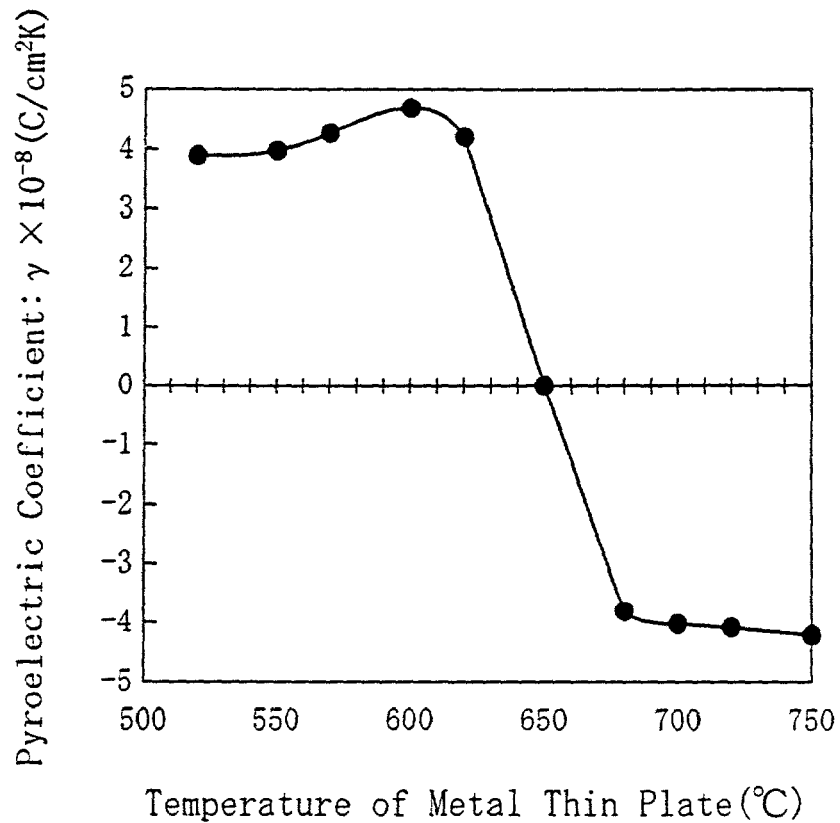
FIG. 9 is a view showing the relationship between the pyroelectric coefficient of PLT and the temperature of a metal thin plate.
Figure 10:
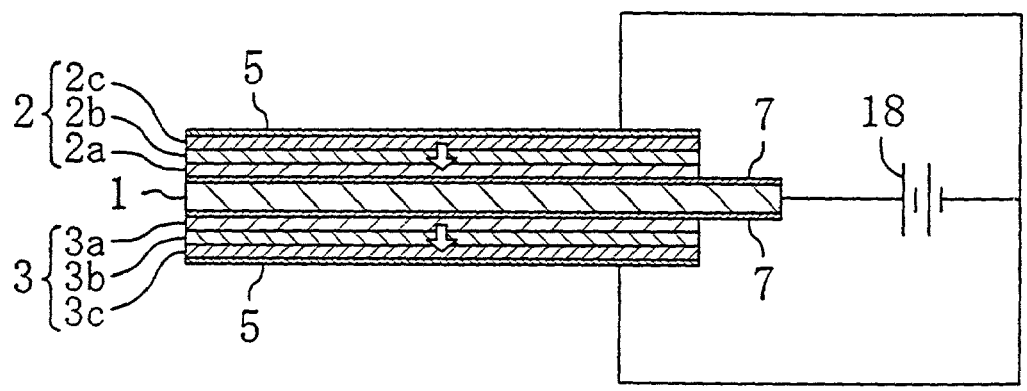
FIG. 10 is a cross-sectional view of a thin-film piezoelectric bimorph element according to a variation of Embodiment 3.

In the case of using PLT, the relationship between the pyroelectric coefficient and the temperature of the metal thin plate 1 is as shown in FIG. 9 (the positive direction of a pyroelectric current is from the side opposite to the metal thin plate 1 toward the meal thin plate 1). If the temperature of the metal thin plate 1 is adjusted to 670 to 720° C., the pyroelectric current flows in a negative direction so that the direction of polarization is from the side opposite to the metal thin plate 1 toward the metal thin plate 1 (downward). If the temperature of the metal thin plate 1 is adjusted to 570 to 630° C. as in Embodiment 1, the pyroelectric current flows in the positive direction so that the direction of polarization is from the metal thin plate 1 toward the opposite side thereof.

Next, the other of the diffusion preventing films 7 is oriented upward and the second piezoelectric thin film 3 is formed by sputtering on the upper surface thereof (see FIG. 8(*c*)). At this time, the temperature of the meal thin plate 1 is adjusted to 570 to 630° C. Specifically, the second piezoelectric thin film 3 is formed by sputtering, while the temperature of the metal thin plate 1 is adjusted to a level lower than the temperature during the formation of the first piezoelectric thin film 2 and the state of polarization thereof is controlled. As a result, the direction of polarization of the second piezoelectric thin film 3 is from the metal thin plate 1 toward the opposite side thereof (upward) so that the directions of polarizations of the first and second piezoelectric thin films 2 and 3 are the same.

Next, the pair of electrode films 5 are formed on the respective surfaces of the first and second piezoelectric thin films 2 and 3 which are opposite to the metal thin plate 1 (see FIG. 8(*d*)), similarly to Embodiment 1. Thereafter, the first and second piezoelectric thin films 2 and 3 and the pair of electrode films 5 are patterned as required.

Since Embodiment 3 has also formed the first and second piezoelectric thin films 2 and 3 by sputtering on the both surfaces of the metal thin plate 1 which are in opposing relation to each other along the thickness thereof, similarly to Embodiment 1, the same effects as obtained in Embodiment 1 are obtained.

In Embodiment 3 also, each of the first and second piezoelectric thin films 2 and 3 may be formed to have a multilayer structure or a piezoelectric constant which gradually increases with distance from the metal thin plate 1 toward the opposite side thereof.

Embodiment 4

Figure 11:
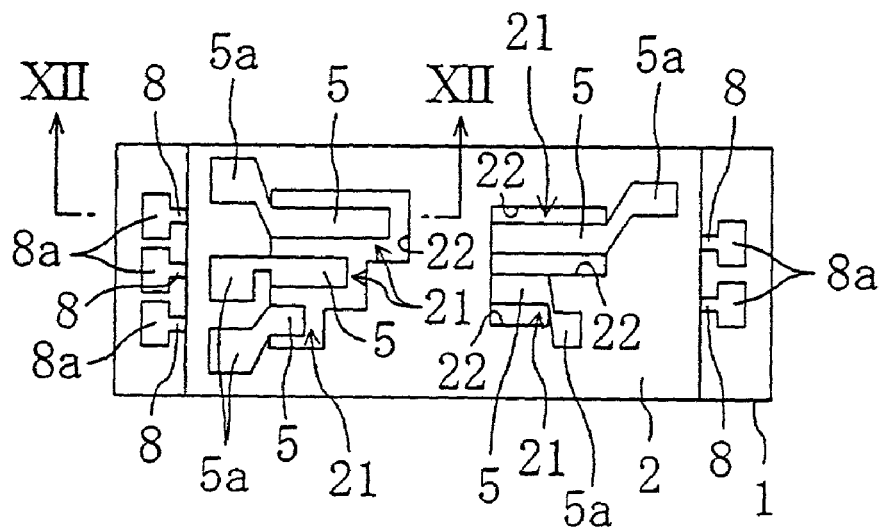
FIG. 11 is a plan view of a mechanical detector according to Embodiment 4 of the present invention.
Figure 12:
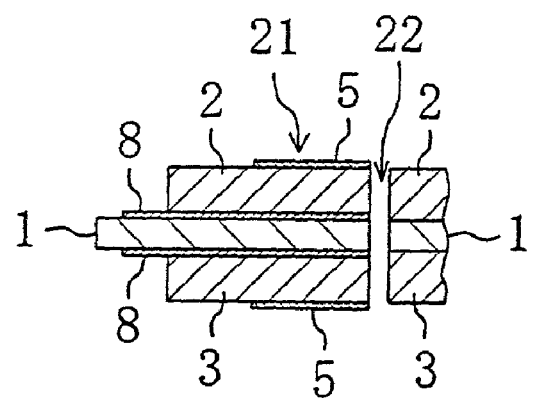
FIG. 12 is a cross-sectional view taken along the line XII—XII of FIG. 11.

FIGS. 11 and 12 show a mechanical detector according to Embodiment 4 of the present invention. The mechanical detector is used as a sensor for sensing a dynamic amount such as pressure or acceleration. Similarly to the thin-film piezoelectric bimorph element described above, the mechanical detector also comprises: a metal thin plate 1 made of stainless steel; first and second piezoelectric thin films 2 and 3 formed by sputtering on the both surfaces of the metal thin plate 1 which are in opposing relation to each other along the thickness thereof, while the respective states of polarizations thereof are controlled; and a pair of electrode films 5 made of Pt provided on the respective surfaces of the first and second piezoelectric thin films 2 and 3 which are opposite to the metal thin plate 1 (referred to as outer electrode films in Embodiments 4, 5, and 8 for the distinction between the electric films 5 and inner electrode films 8, which will be described later).

The mechanical detector is provided with five dynamic amount detecting portions 21. The pair of outer electrode films 5 are patterned to be located correspondingly to the individual dynamic amount detecting portions 21. Holes 22 for forming the detecting portions are formed in the metal thin plate 1 and in the first and second piezoelectric thin films 2 and 3 to surround the dynamic amount detecting portions 21. The holes 22 for forming the detecting portions sequentially penetrate the metal thin plate 1 and the first and second piezoelectric thin films 2 and 3. With the holes 22 for forming the detecting portions, the three dynamic amount detecting portions 21 located on the left hand of FIG. 11 are configured as cantilevers, while the two dynamic amount detecting portions 21 located on the right hand of FIG. 11 are configured as fixed-end beams, so that the dynamic amount detecting portions are likely to be deformed. It follows therefore that the mechanical detector 21 is composed of thin-film piezoelectric bimorph elements each having the metal thin plate 1, the first and second piezoelectric thin films 2 and 3 formed by sputtering on the both surfaces of the metal thin plate 1 which are in opposing relation to each other along the thickness thereof, while the respective states of polarizations thereof are controlled, and the pair of outer electrode films 5 provided on the respective surfaces of the first and second piezoelectric thin films 2 and 3 which are opposite to the metal thin plate 1. The dynamic amount detecting portions 21 are formed to have different lengths, which renders the respective natural frequencies of the dynamic amount detecting portions 21 different from each other.

The directions of polarizations of the first and second piezoelectric thin films 2 and 3 may be opposite to each other, as in Embodiment 1, or the same, as in Embodiment 3.

The pair of inner electrode films 8 made of Pt (which perform the same function in the individual dynamic amount detecting portions 21 as the diffusion preventing films 7 of the thin-film piezoelectric bimorph elements of Embodiments 1 to 3) are formed by patterning to be located correspondingly to the individual dynamic amount detecting portions 21 between the metal thin plate 1 and the first and second piezoelectric thin films 2 and 3. Each of the inner electrode films 8 has one end portion provided with an electric contact portion 8a, which is uncovered with the first and second piezoelectric thin films 2 and 3. Each of the outer electrode films 5 also has an electric contact portion 5a adjacent the corresponding one of the dynamic amount detecting portions 21.

A description will be given below to a method of manufacturing the mechanical detector with reference to FIG. 13.

First, the pair of inner electrode films 8 are formed on the both surfaces of the metal thin plate 1 which are in opposing relation to each other along the thickness thereof. The inner electrode films 8 are then patterned by etching into specified configurations (see FIG. 13(a)). A method of forming the inner electrode films 8 is the same as the method of forming the diffusion preventing films 7 used in Embodiment 1. A method of etching is the same as the method of etching the electrode films 5 used in Embodiment 1.

Figure 13A:
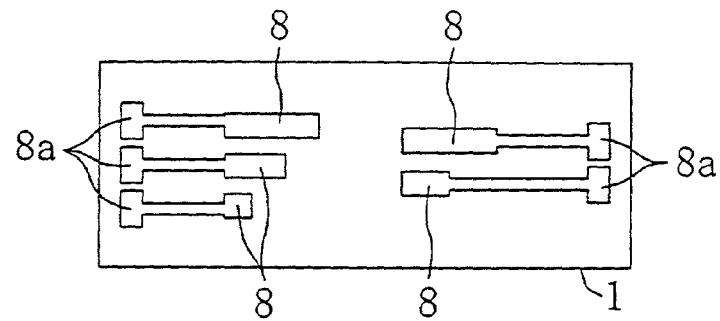
FIGS. 13(a) through (d) are schematic views illustrating a method of manufacturing the mechanical detector of FIG. 11.
Figure 13B:
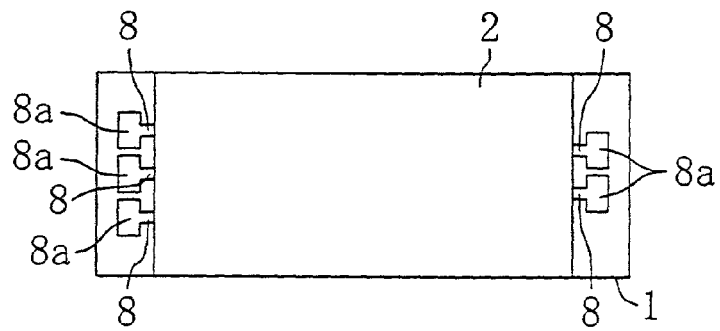
Figure 13C:
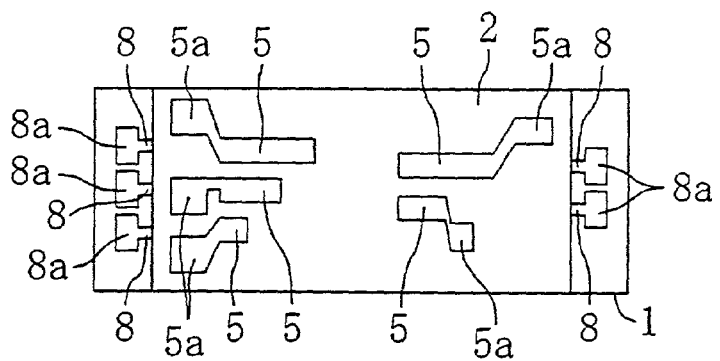
Figure 13D:
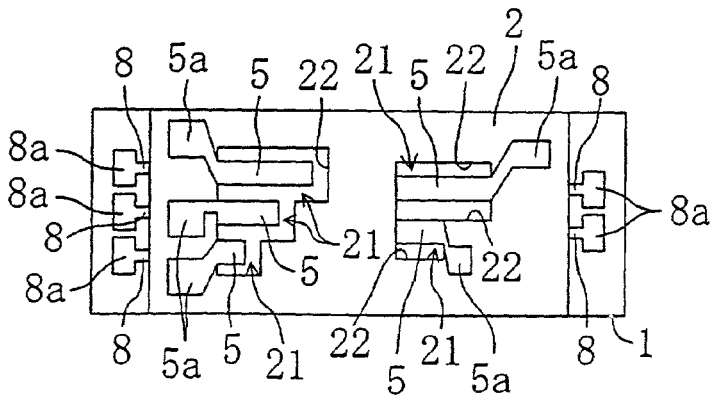
Figure 14A:
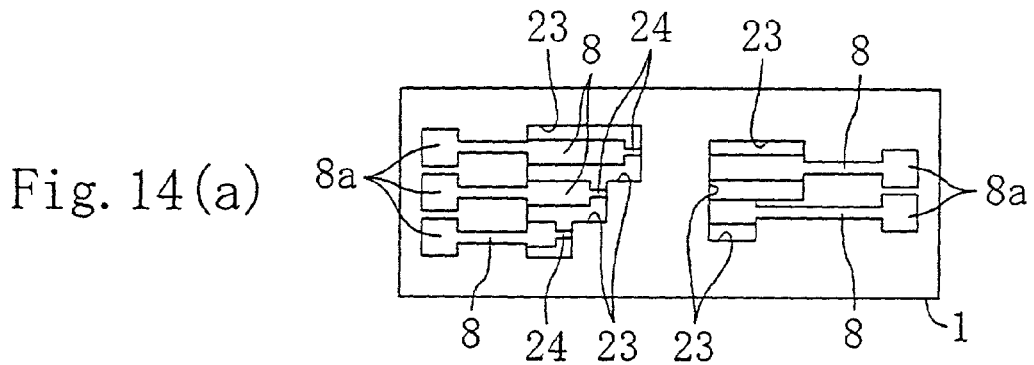
FIGS. 14(a) through (d) are schematic views illustrating another method of manufacturing the mechanical detector of FIG. 11.
Figure 14B:
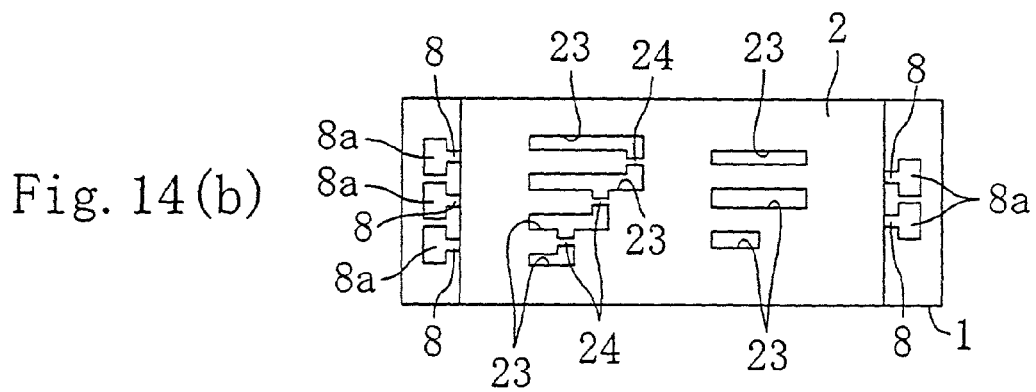
Figure 14C:
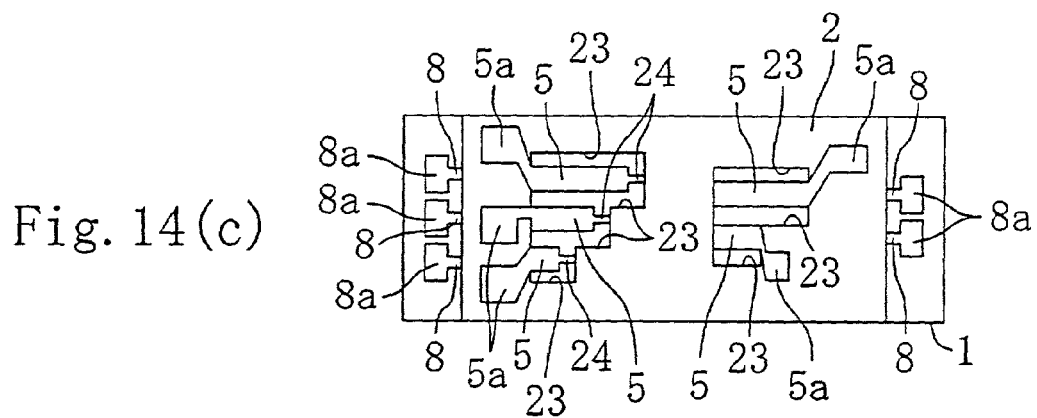
Figure 14D:
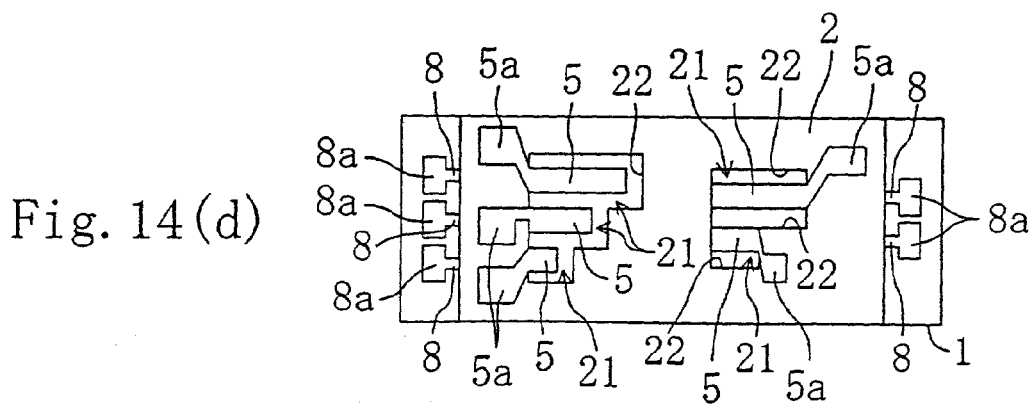

Subsequently, the first and second piezoelectric thin films 2 and 3 are formed by sputtering on the both surfaces of the metal thin plate 1 (on the portions other than the right and left end portions on which the electric contact portions 8a of the inner electrode films 8 are located) which are formed with the respective inner electrode films 8 and in opposing relation to each other along the thickness thereof, while the respective states of polarizations thereof are controlled (see FIG. 13(b)), similarly to Embodiments 1 to 3.

Next, the pair of outer electrode films 5 are formed on the respective surfaces of the first and second piezoelectric thin films 2 and 3 which are opposite to the metal thin plate 1. The outer electrode films 5 are then patterned by etching into specified configurations (see FIG. 13(c)). A method of forming and etching the outer electrode films 5 is the same as the method of forming and etching the electrode films 5 used in Embodiment 1.

Next, the portions of the first and second piezoelectric thin films 2 and 3 corresponding to the periphery of the outer electrode films 5 are etched in the same manner as in Embodiment 1 (see Table 2). Thereafter, the portion of the metal thin plate 1 corresponding to the periphery of the outer electrode films 5 is processed by etching, so that the holes 22 for forming the detecting portions (see FIG. 13(d)) are formed and the dynamic amount detecting portions 21 having specified configurations are thereby formed.

FIG. 14 illustrates another method of manufacturing the foregoing mechanical detector, in which through holes 23 having generally the same configurations as the holes 22 for forming the detecting portions are formed preliminarily in the metal thin plate 1. However, the portions corresponding to the three dynamic amount detecting portions 21 configured as cantilevers have their tip portions coupled to the portions of the inner surfaces of the through holes 23 with fine coupling portions 24 such that they are not deformed in the manufacturing process.

In accordance with the manufacturing method, the through holes 23 are formed first in the metal thin plate 1 such that the portions corresponding to the dynamic amount detecting portions 21 and the coupling portions 24 are formed. Then, the pair of inner electrode films 8 are formed on the both surfaces of the metal thin plate 1 formed with the through holes 23 which are in opposing relation to each other along the thickness thereof. The inner electrode films 8 are then patterned by etching into specified configurations (see FIG. 14(a)). Next, the first and second piezoelectric thin films 2 and 3 are formed on the respective surfaces of the metal thin plate 1 which are in opposing relation to each other along the thickness thereof and formed with the respective inner electrode films 8 (see FIG. 14(b)). At this time, the first and second piezoelectric thin films 2 and 3 are formed not to cover the through holes 23 of the metal thin plate 1. Subsequently, the pair of outer electrode films 5 are formed on the respective surfaces of the first and second piezoelectric thin films 2 and 3 which are opposite to the metal thin plate 1. The outer electrode films 5 are then patterned by etching into specified configurations (see FIG. 14(c)). Finally, the coupling portions 24 are subjected to a cutting process using a laser (which may also be subjected to an etching process), so that the holes 22 for forming the detecting portions are formed (the through holes 23 which are unformed with the coupling portions 24 serve as the holes 22 for forming the detecting portions without any alterations) and the mechanical detector comprising the dynamic amount detecting portions 21 having specified configurations are thereby completed.

Since Embodiment 4 has thus formed the dynamic amount detecting portions 21 by forming the first and second piezoelectric thin films 2 and 3 by sputtering on the both surfaces of the metal thin plate 1 which are in opposing relation to each other along the thickness thereof, a compact and high-performance mechanical detector can be obtained easily at low cost. Moreover, since the plurality of dynamic amount detecting portions 21 can be formed simultaneously and easily, the mechanical detector can sense a wide variety of frequencies if it is used as an acceleration sensor or the like by rending the lengths of the plurality of dynamic amount detecting portions 21, i.e., the natural frequencies thereof different from each other.

Embodiment 5

Figure 15:
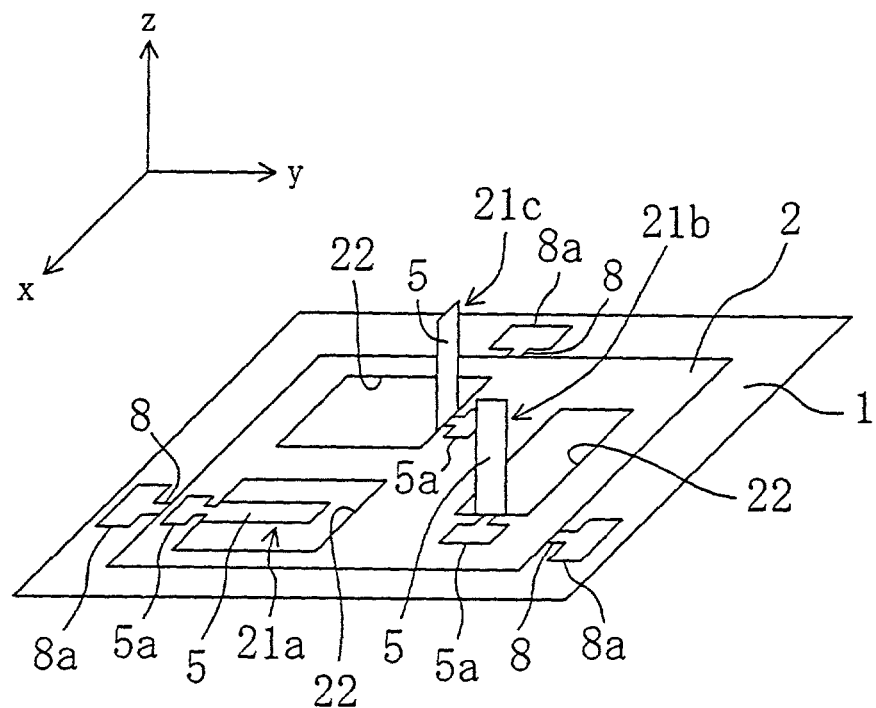
FIG. 15 is a schematic perspective view of a mechanical detector according to Embodiment 5 of the present invention.

FIG. 15 shows Embodiment 5 of the present invention, in which three dynamic amount detecting portions 21 each composed of a thin-film piezoelectric bimorph element (the first, second, and third dynamic amount detecting portions 21a, 21b, and 21c) are provided, similarly to Embodiment 4, so as to bend in different directions. It is to be noted that the metal thin plate 1 and the individual films are depicted in FIG. 15 by omitting the thicknesses thereof.

Specifically, the first dynamic amount detecting portion 21a of Embodiment 5 extends in a direction (the y-direction in FIG. 15) parallel to the both surfaces of the metal thin plate 1 which are in opposing relation to each other along the thickness thereof and bends in the direction (the z-direction in FIG. 15) of the thickness of the metal thin plate 1, similarly to Embodiment 4. On the other hand, the second dynamic amount detecting portion 21b of Embodiment 5 is bent at the proximal end thereof to extend in the z-direction and bend in the x-direction which is perpendicular to the y- and z-directions, while the third mechanical detector 21c of Embodiment 5 is bent at the proximal end thereof to extend in the z-direction and bend in the y-direction. Thus, the first to third dynamic amount detecting portions 21a, 21b, and 21c are designed to bend in the directions perpendicular to each other. The mechanical detector is for triaxial detection and capable of detecting respective dynamic amounts in the x-, y-, and z-directions.

The method of manufacturing the mechanical detector is generally the same as in Embodiment 4 until the process reaches the step of forming the holes 22 for forming the detecting portions. After the holes 22 for forming the detecting portions are formed, the second and third dynamic amount detecting portions 21b and 21c are bent by 90° at the proximal ends thereof (a bending process is performed with respect to the metal thin plate 1) into specified configurations. After the bending process, a heat treatment involving heating and rapid cooling may also be performed with respect to the bent portions (proximal ends) or, alternatively, a hardening resin may also be applied to the bent portions, as required. As a result, the bent portions are fixed reliably and the bending angle is stable over a long period of time.

Thus, the same effects as obtained in Embodiment 4 are also obtainable in Embodiment 5 and pressure or acceleration acting in mutually perpendicular triaxial directions can be detected by a single mechanical detector.

Although each of the first to third dynamic amount detecting portions 21a, 21b, and 21c is provided on a one-by-one basis in Embodiment 5, each of the first to third dynamic amount detecting portions 21a, 21b, and 21c may be provided in a plural number. In short, plural sets of first to third dynamic amount detecting portions 21a, 21b, and 21c may be provided. In that case, the first to third dynamic amount detecting portions 21a, 21b, and 21c in different sets preferably have different lengths (natural frequencies).

The first to third dynamic amount detecting portions 21a, 21b, and 21c may bend in any directions. The directions in which the first to third dynamic amount detecting portions 21a, 21b, and 21c bend are determined appropriately depending on the direction of a dynamic amount to be detected.

Embodiment 6

Figure 16:
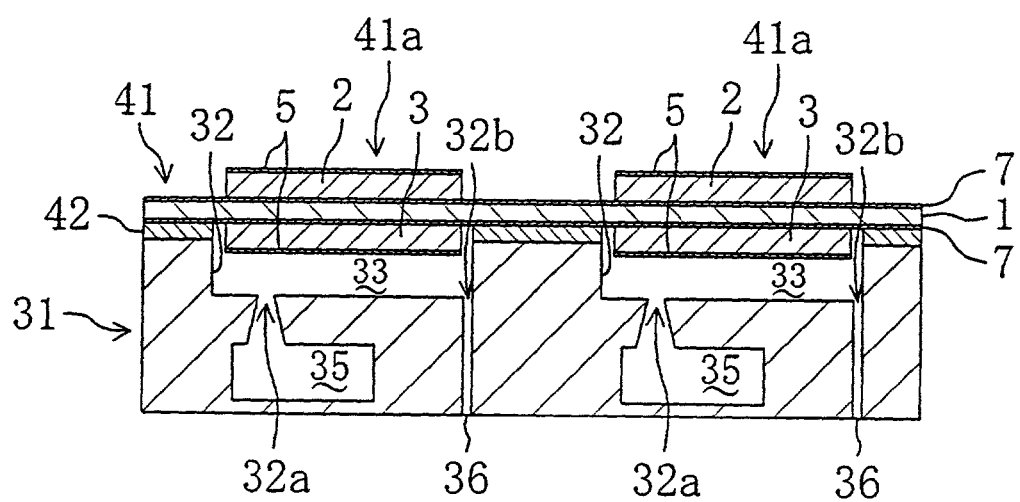
FIG. 16 is a cross-sectional view of an inkjet head according to Embodiment 6 of the present invention.

FIG. 16 shows an inkjet head according to Embodiment 6 of the present invention. The inkjet head comprises a head main body 31 formed with a plurality of depressed portions 32 for pressure chambers having supply ports 32a for ink supply and discharge ports 32b for ink discharge. The depressed portions 32 are arranged in rows (two rows in the present embodiment) in a direction perpendicular to the paper surface of FIG. 16.

The supply ports 32a are connected to ink supply passages 35 extending in the direction in which the rows of depressed portions 2 are arranged. The ink supply passages 35 are connected to an ink tank not shown. On the other hand, the discharge ports 32b are connected to nozzle slots 36 provided in the bottom surface of the head main body 31 for the respective depressed portions 32 on a one-by-one basis.

An actuator 41 which covers the depressed portions 32 to compose the pressure chambers 33 in combination with the depressed portions 32 is provided on the upper surface (the surface formed with the depressed portions) of the head main body 31. The actuator 41 causes ink within the pressure chambers 33 to be discharged from the discharge ports 32 and from the nozzle slots 36 such that the ink adheres to a recording sheet disposed in opposing relation to the bottom surface of the head main body 31. The actuator 41 is composed of thin-film piezoelectric bimorph elements each having: a metal thin plate 1 made of stainless steel; first and second piezoelectric thin films 2 and 3 formed by sputtering on the both surfaces of the metal thin plate 1 which are in opposing relation to each other along the thickness thereof, while the respective states of polarizations of the first and second piezoelectric thin films 2 and 3 are controlled; and a pair of electrode films 5 made of Pt and provided on the respective surfaces of the first and second piezoelectric thin films 2 and 3 which are opposite to the metal thin plate 1. The directions of polarizations of the first and second piezoelectric thin films 2 and 3 may be opposite to each other as in Embodiment 1 or may be the same as in Embodiment 3.

The actuator 41 has drive portions 41a provided at portions corresponding to the individual depressed portions 32 of the head main body 31. The first and second piezoelectric thin films 2 and 3 and the pair of electrode films 5 are patterned to be located correspondingly to the individual drive portions 41. It is to be noted that a pair of diffusion preventing films 7 are provided entirely over the metal thin plate 1 and between the metal thin plate 1 and the first and second piezoelectric thin films 2 and 3, similarly to the thin-film piezoelectric bimorph elements according to Embodiments 1 to 3.

The portions of the actuator 41 other than the drive portions 41a are fixed to the upper surface of the head main body 31 with an adhesive agent 42 interposed therebetween. Specifically, the metal thin plate 1 is fixed adhesively to the upper surface of the head main body 31 with the diffusion preventing film 7 interposed therebetween and both the second piezoelectric thin film 3 and the electrode film 5 on the second piezoelectric thin film 3 are located within the depressed portions 32 of the head main body 31. As a result, the second piezoelectric thin film 3 and the electrode film 5 on the second piezoelectric thin film 3 are exposed to the ink so that each of the films 3 and 5 is preferably covered with, e.g., a thin organic or inorganic insulating film, though it is not depicted.

The actuator 41 selectively applies, for each of the drive portions 41a, a pulse-like voltage to the first and second piezoelectric thin films 2 and 3. Each of the drive portions 41a is deformed on a rising edge of the pulse voltage in such a manner as to protrude downward. The deformation produces a pressure in the pressure chamber 33 so that the ink within the pressure chamber 33 is discharged under the pressure from the discharge port 32b and from the nozzle slot 36 to the outside to adhere in dots to the paper surface of the recording sheet. On a falling edge of the pulse voltage, the drive portion 41a returns to the original state so that the ink is filled in the pressure chamber 33 via the ink supply passage 35 and the supply port 32a.

Next, a description will be given to a method of manufacturing the inkjet head with reference to FIG. 17.

Figure 17A:
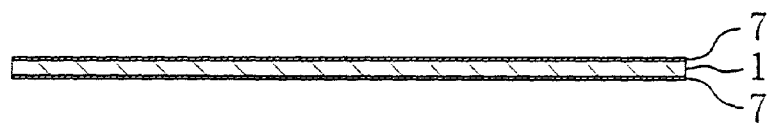
FIGS. 17(a) through (d) are schematic views illustrating a method of manufacturing the inkjet head of FIG. 16.
Figure 17B:
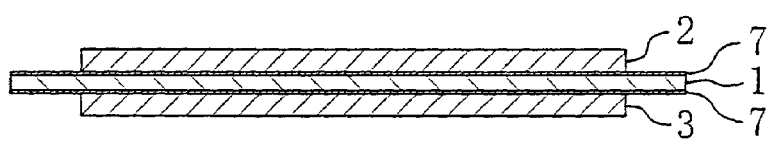
Figure 17C:
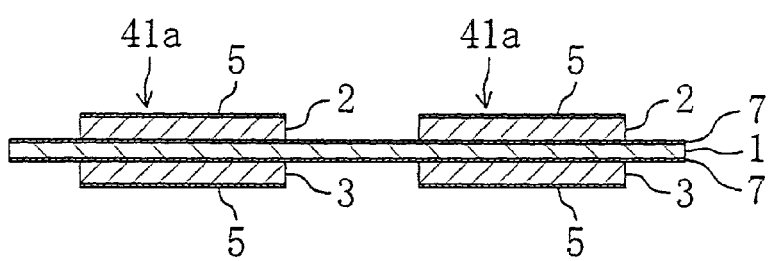

First, the pair of diffusion preventing films 7 are formed on the both surfaces of the metal thin plate 1 which are in opposing relation to each other along the thickness thereof (see FIG. 17(a)), similarly to Embodiment 1. Thereafter, the first and second piezoelectric thin films 2 and 3 are formed by sputtering, while the respective states of polarizations thereof are controlled (see FIG. 17(b)), similarly to Embodiment 1 or 3.

Subsequently, the pair of electrode films 5 are formed on the respective surfaces of the first and second piezoelectric thin films 2 and 3 which are opposite to the metal thin plate 1, similarly to Embodiment 1. Thereafter, each of the pair of electrode films 5 and of the first and second piezoelectric thin films 2 and 3 is patterned into a specified configuration, whereby the drive portions 41a are formed (see FIG. 17(c)).

Figure 17D:
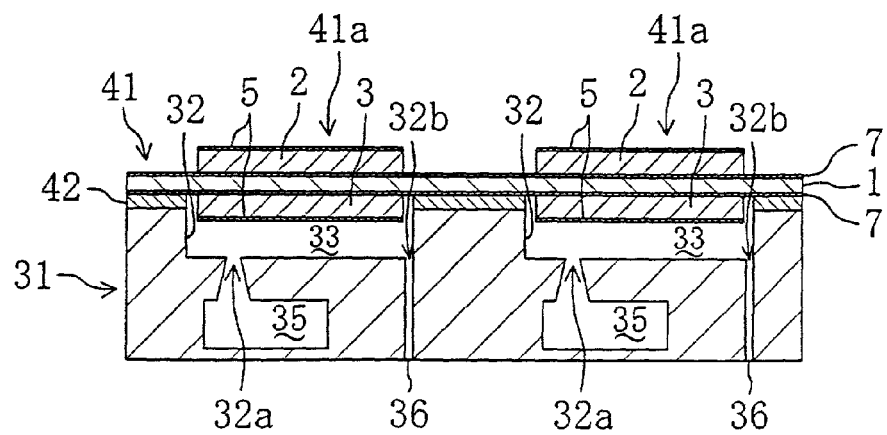

Next, the metal thin plate 1 is fixed adhesively to the head main body 31 preliminarily formed with the depressed portions 32 for pressure chambers, whereby the inkjet head is completed (see FIG. 17(d)).

Since Embodiment 6 has thus formed the actuator 41 by forming the first and second piezoelectric thin films 2 and 3 by sputtering on the both surfaces of the metal thin plate 1 which are in opposing relation to each other along the thickness of thereof, a compact and high-performance actuator 41 can be obtained easily at low cost, similarly to the thin-film piezoelectric bimorph elements of Embodiments 1 and 3, so that the gradation of printing is improved. Moreover, the configuration of the actuator 41 and the placement of the drive portions 41 can be determined arbitrarily.

Furthermore, the flexibility of the configuration and size of the inkjet head can be enhanced.

Embodiment 7

Figure 18:
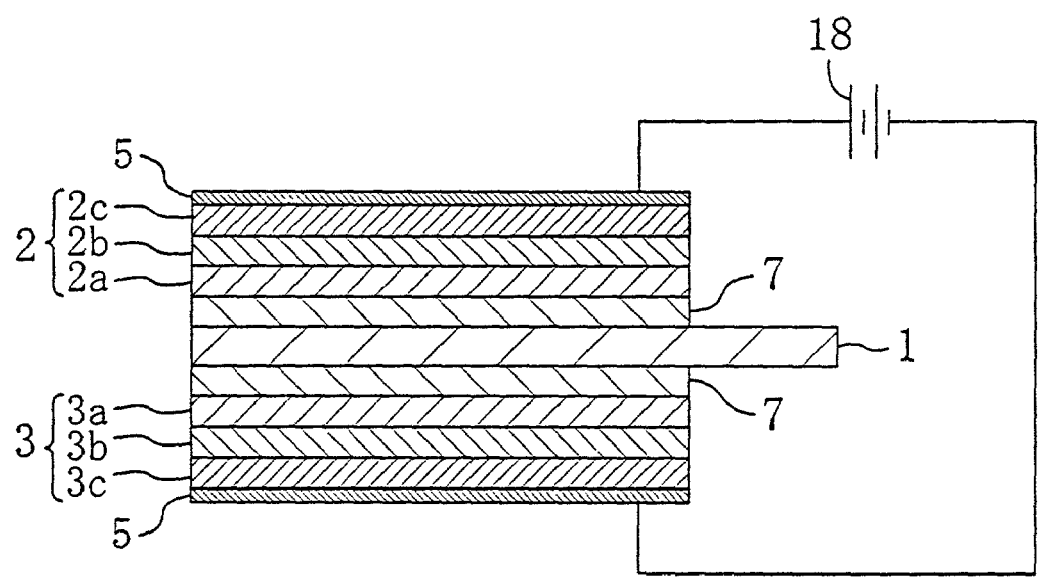
FIG. 18 is a cross-sectional view of a thin-film piezoelectric bimorph element according to Embodiment 7 of the present invention.

FIG. 18 shows a thin-film piezoelectric bimorph element according to Embodiment 7 of the present invention, in which a pair of diffusion preventing films 7 made of $PbZrO_3$ or the like which does not have a piezoelectric effect are provided between the first and second piezoelectric thin films 2 and 3, each having a multilayer structure similarly to Embodiment 2, and the metal thin plate 1.

Thus, in Embodiment 7, the diffusion preventing films 7 are not metal films and do not function as electrode films but prevent the diffusion of Cr or the like contained in the metal thin plate 1 in the first and second piezoelectric thin films 2 and 3. Since the diffusion preventing films 7 do not have a piezoelectric effect, it achieves the effect of reducing stresses produced in the piezoelectric layers 2a and 3a of the first and second piezoelectric thin films 2 and 3 closer to the metal thin plate 1. Therefore, the durability of the thin-film piezoelectric bimorph element can further be increased than in Embodiment 2.

Embodiment 8

Figure 19:
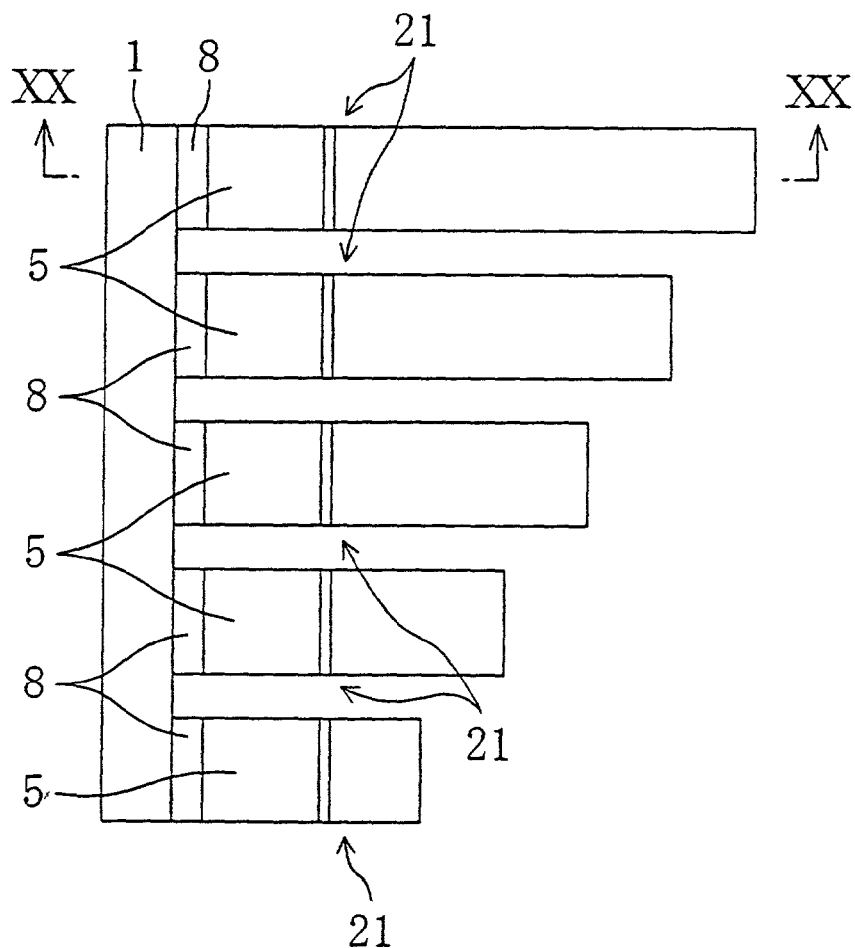
FIG. 19 is a plan view of a mechanical detector according to Embodiment 8 of the present invention.
Figure 20:
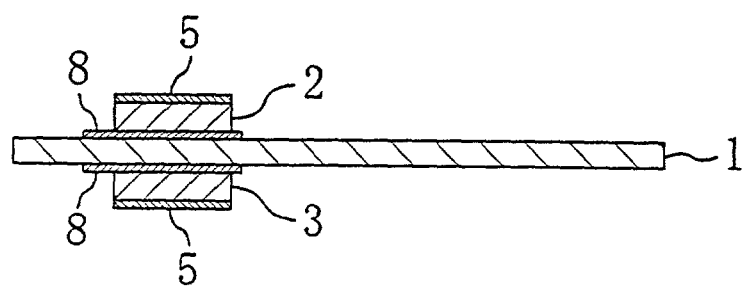
FIG. 20 is a cross-sectional view taken along the line XX—XX of FIG. 19.

FIGS. 19 and 20 show a mechanical detector according to Embodiment 8 of the present invention, which has a structure different from the structure of the mechanical detector in Embodiment 4.

Specifically, in Embodiment 8, five dynamic amount detecting portions 21 are arranged in a row and configured as five cantilevers. Each of the dynamic amount detecting portions 21 has a proximal portion composed of a metal thin plate 1, first and second piezoelectric thin films 2 and 3, an outer electrode film 5, and an inner electrode film 8, similarly to the dynamic amount detecting portions 21 in Embodiment 4, while having a distal portion composed only of the metal thin plate 1. The distal portions of the dynamic amount detecting portions 21 have different lengths, while the proximal portions thereof have equal lengths. Accordingly, the five dynamic amount detecting portions 21 have different natural frequencies. In addition, the proximal portions of the dynamic amount detecting portions 21 are connected to each other by only the metal thin plate 1.

A method of manufacturing such a mechanical detector is also the same as in Embodiment 4 and allows easy and low-cost formation of a compact and high-performance mechanical detector. In the case where the mechanical detector is used as an acceleration sensor, it can sense a wide variety of frequencies.

Figure 21:
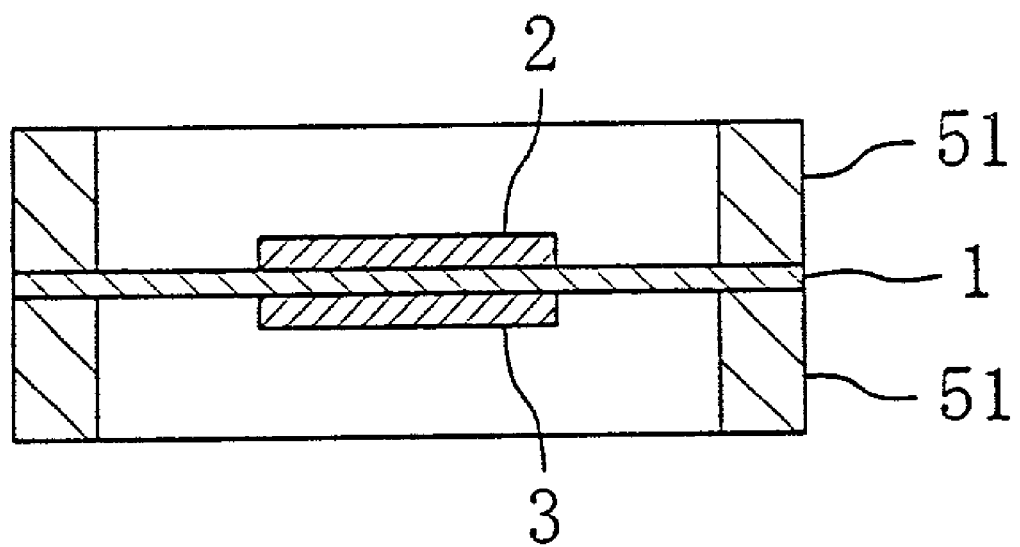
FIG. 21 is a cross-sectional view illustrating a method of applying an external force to a circular metal thin plate.

Although each of the foregoing embodiments has controlled the temperature of the metal thin plate 1 for polarization control, it is also possible to apply an external force to the metal thin plate 1. A description will be given to a method of applying an external force to the metal thin plate 1 with reference to FIG. 21. The method uses a circular metal thin plate 1. First and second piezoelectric thin films 2 and 3 are formed with ring-shaped metal rings 51 bonded to the peripheral portions of the both surfaces of the metal thin plate 1 which are in opposing relation to each other along the thickness thereof. Each of the metal rings 51 is made of a material having a thermal expansion coefficient higher than that of the metal thin plate 1. If the metal thin plate 1 is composed of stainless steel (with a thermal expansion coefficient of 9 to $18\times10^{-6}/°$ C.) or Cr (with a thermal expansion coefficient of $7\times10^{-6}/°$ C.), for example, the metal rings 51 are composed appropriately of Al (with a thermal expansion coefficient of $24\times10^{-6}/°$ C.), Mn (with a thermal expansion coefficient of $23\times10^{-6}/°$ C.), or the like. By using the metal rings 51, the metal thin plate 1 can be stretched outwardly diametrically by properly adjusting an ambient temperature during film formation. Consequently, the metal thin plate 1 contracts if a room temperature is restored after film formation such that thermal stresses in the first and second piezoelectric thin films 2 and 3 are reduced and the polarization axes are equally oriented in the (001) direction, as described in Embodiment 1. In accordance with the method, a compressing force also acts on the first and second piezoelectric thin films 2 and 3 at a room temperature. Accordingly, the strengths of the first and second piezoelectric thin films 2 and 3 which are sensitive to a tensile force can be increased.

Figure 22:
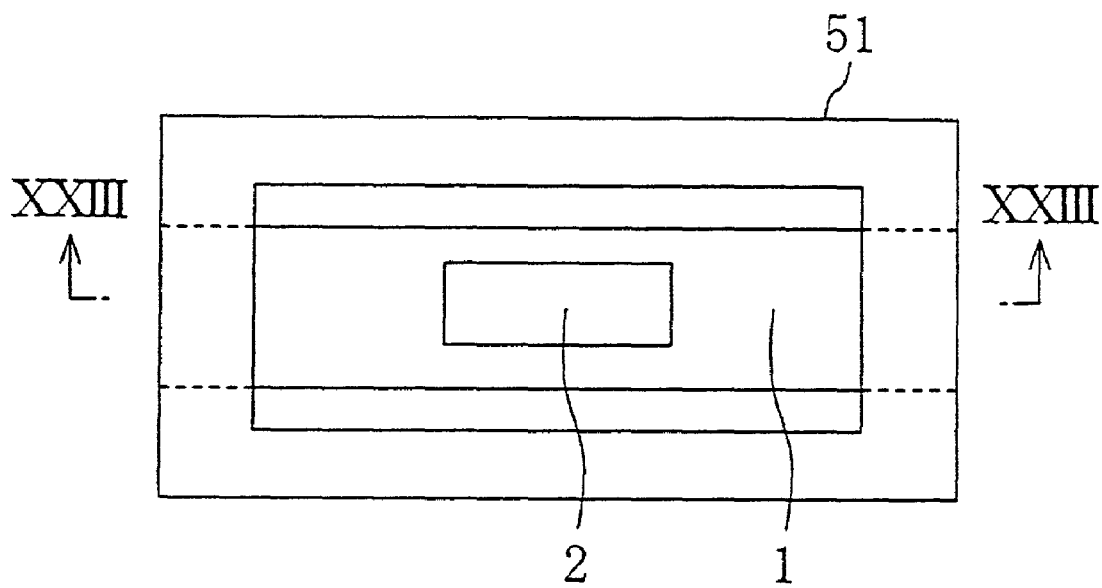
FIG. 22 is a plan view illustrating a method of applying an external force to an elongated rectangular metal thin plate.
Figure 23:
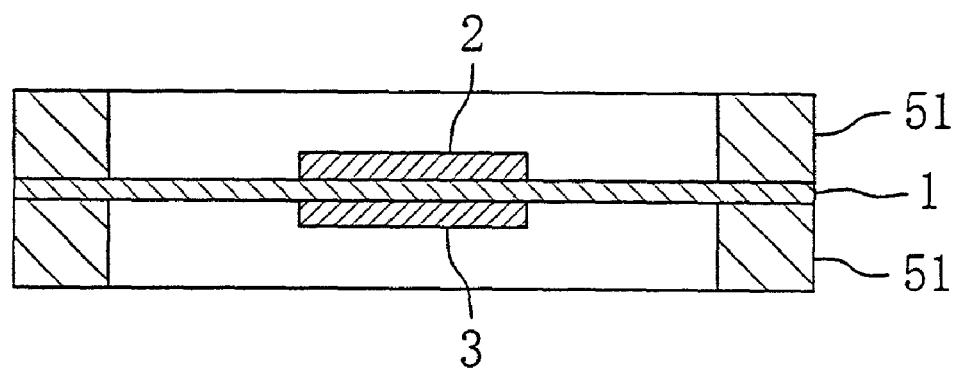
FIG. 23 is a cross-sectional view taken along the line XXIII—XXIII of FIG. 22.

In the case of using a metal thin plate 1 having an elongated rectangular configuration, it is also possible to apply a tensile force only lengthwise of the metal thin plate 1 by bonding metal rings 51 configured as rectangular frames to the metal thin plate 1, as shown in FIGS. 22 and 23.

Figure 24:
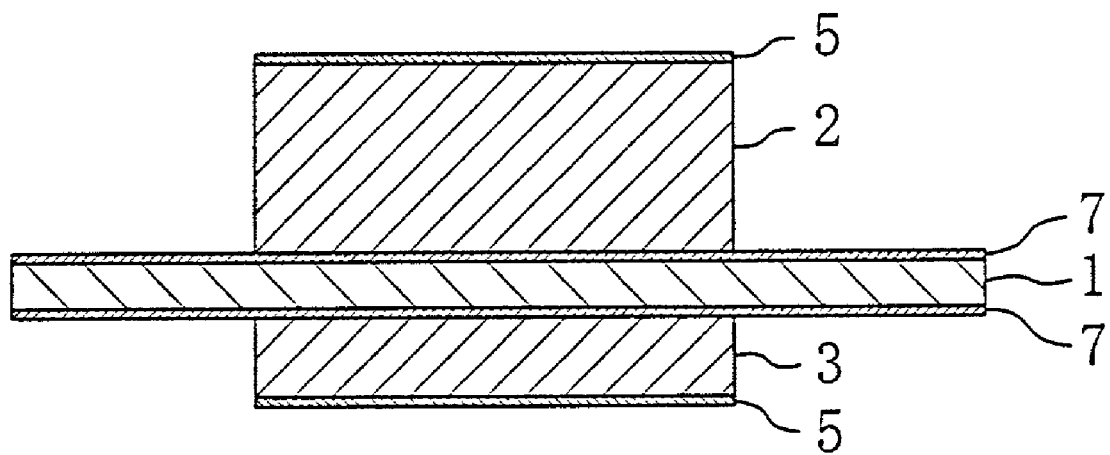
FIG. 24 is a cross-sectional view of a thin-film piezoelectric bimorph element in which a pair of piezoelectric thin films have different thicknesses.

Although the first and second piezoelectric thin films 2 and 3 have equal thicknesses in each of the foregoing embodiments, the first and second piezoelectric thin films 2 and 3 may have different thicknesses, as shown in FIG. 24. In the case where a tensile force constantly acts on the first piezoelectric thin film 2 and a compressive force constantly acts on the second piezoelectric thin film 3, e.g., resistance to the tensile force is also provided if the first piezoelectric thin film 2 is formed to be thicker than the second piezoelectric thin film 3, as shown in FIG. 24, so that durability is increased. Even if the first and second piezoelectric thin films 2 and 3 are formed to have different thicknesses, the bent configuration is hardly affected since the rigidity of the metal thin plate 1 is by far higher than that of the first and second piezoelectric thin films 2 and 3.

A description will be given to a method of manufacturing a more compact thin-film piezoelectric bimorph element used as an actuator 41 for an inkjet head or the like.

Figure 25A:
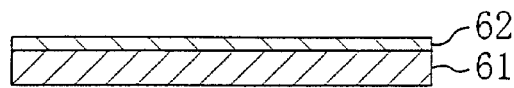
FIGS. 25 (a) through (d) are schematic views illustrating a method of manufacturing a more compact thin-film piezoelectric bimorph element.

First, a metal thin film 62 having a thickness of about 2 to 10 µm is formed by sputtering on a substrate 61 for film formation made of MgO (see FIG. 25(a)).

Figure 25B:
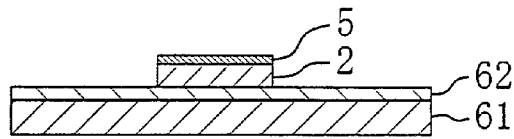

Subsequently, a first piezoelectric thin film 2 and an electrode film 5 are formed successively on the metal thin film 62 and then patterned (see FIG. 25(b)).

Figure 25C:
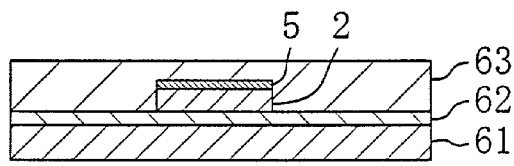

Next, a MgO film 63 is formed entirely over the metal thin film 62 formed with the first piezoelectric thin film 2 and the electrode film 5 (see FIG. 25(c)). Thereafter, the MgO film 63 is covered with a protective material not shown.

Figure 25D:
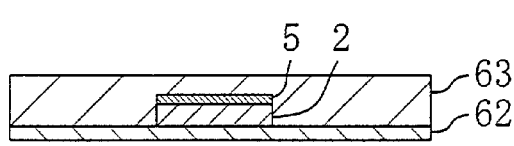
Figure 25E:
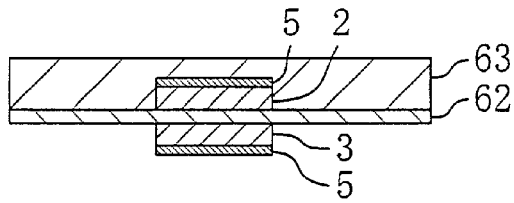

The substrate 61 for film formation is then molten away by phosphoric acid or the like (see FIG. 25(d)). Thereafter, a second piezoelectric thin film 3 and the electrode film 5 are formed on the surface of the metal thin film 62 from which the substrate 61 for film formation has been removed (see FIG. 25(e)).

Figure 25F:
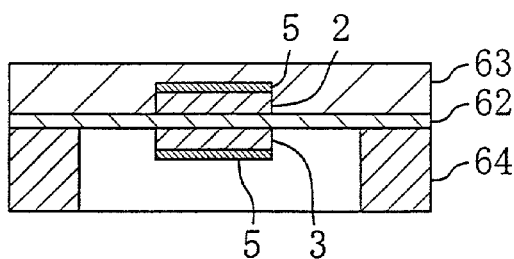
Figure 25G:
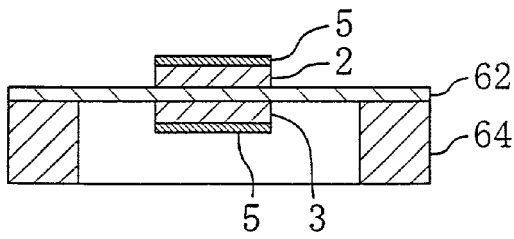

Subsequently, the surface of the metal thin film 62 from which the substrate 61 for film formation has been removed is fixed to a structure 64 such as the head main body 31 (see FIG. 25(f)). Thereafter, the MgO film 63 is removed (see FIG. 25(g)).

By implementing the method, the metal thin plate 1 composed of the metal thin film 62 and having a considerably reduced thickness can be formed. Since the metal thin film 62 is supported by at least one of the substrate 61 for film formation and the MgO film 63 in the manufacturing process, it is free of bending or deformation. Since the first and second piezoelectric thin films 2 and 3 are formed by sputtering, while the respective states of polarizations thereof are controlled, there can be obtained a compact and high-performance thin-film piezoelectric bimorph element, similarly to each of the foregoing embodiments.

What is claimed is:

1. A method for controlling a direction of polarization of a piezoelectric thin film during the forming of the piezoelectric thin film by sputtering on one surface of a metal thin plate, the method comprising the steps of:

forming the piezoelectric thin film by sputtering on one surface of the metal thin plate, while controlling a temperature of the metal thin plate such that a direction of a pyroelectric current of the piezoelectric thin film flows from the side opposite to the metal thin plate of the piezoelectric thin film to the side of the metal thin plate, when the direction of polarization of the piezoelectric thin film is to be set from the side of the metal thin plate of the piezoelectric thin film to the side opposite to the metal thin plate; and forming the piezoelectric thin film by sputtering on one surface of the metal thin plate, while controlling a temperature of the metal thin plate such that a direction of the pyroelectric current of the piezoelectric thin film flows from the side of the metal thin plate of the piezoelectric thin film to the side opposite to the metal thin plate, when the direction of polarization of the piezoelectric thin film is to be set from the side opposite to the metal thin plate of the piezoelectric thin film to the side of the metal thin plate, wherein the piezoelectric thin film is $Pb_p La_q Ti_r Zr_s O_3$, wherein when the direction of polarization of the piezoelectric thin film is set from the side of the metal thin plate of the piezoelectric thin film to the side opposite to the metal thin plate; the temperature of the metal thin plate is set between a range of 500° C. and 630° C., and wherein when the direction of polarization of the piezoelectric thin film is set from the side opposite to the metal thin plate of the piezoelectric thin film to the side of the metal thin plate, the temperature of the metal thin plate is set between a range of 670° C. and 750° C.

2. A method for controlling a direction of polarization of a piezoelectric thin film during the forming of the piezoelectric thin film by sputtering on one surface of a metal thin plate, the method comprising the steps of:

forming the piezoelectric thin film by sputtering on one surface of the metal thin plate, while controlling a temperature of the metal thin plate such that a direction of a pyroelectric current of the piezoelectric thin film flows from the side opposite to the metal thin plate of the piezoelectric thin film to the side of the metal thin plate, when the direction of polarization of the piezoelectric thin film is to be set from the side of the metal thin plate of the piezoelectric thin film to the side opposite to the metal thin plate; and forming the piezoelectric thin film by sputtering on one surface of the metal thin plate, while controlling a temperature of the metal thin plate such that a direction of the pyroelectric current of the piezoelectric thin film flows from the side of the metal thin plate of the piezoelectric thin film to the side opposite to the metal thin plate, when the direction of polarization of the piezoelectric thin film is to be set from the side opposite to the metal thin plate of the piezoelectric thin film to the side of the metal thin plate, wherein the piezoelectric thin film is $Pb_pLa_qTi_rZr_sO_3$, wherein when the direction of polarization of the piezoelectric thin film is set from the side of the metal thin plate of the piezoelectric thin film to the side opposite to the metal thin plate, the temperature of the metal thin plate is set between a range of 570° C. and 630° C., and wherein when the direction of polarization of the piezoelectric thin film is set from the side opposite to the metal thin plate of the piezoelectric thin film to the side of the metal thin plate, the temperature of the metal thin plate is set between a range of 670° C. and 720° C.

* * * * *